United States Patent
Shimizu et al.

(10) Patent No.: US 10,161,971 B2
(45) Date of Patent: Dec. 25, 2018

(54) CURRENT SENSOR THAT DETECTS A MAGNETIC FIELD PRODUCED BY A CURRENT

(71) Applicant: Murata Manufacturing Co., Ltd., Nagaokakyo-shi, Kyoto-fu (JP)

(72) Inventors: Yasuhiro Shimizu, Nagaokakyo (JP); Takashi Kawanami, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 49 days.

(21) Appl. No.: 15/489,766

(22) Filed: Apr. 18, 2017

(65) Prior Publication Data

US 2017/0219634 A1 Aug. 3, 2017

Related U.S. Application Data

(63) Continuation of application No. PCT/JP2015/082235, filed on Nov. 17, 2015.

(30) Foreign Application Priority Data

Dec. 15, 2014 (JP) ................................. 2014-252877

(51) Int. Cl.
*G01J 5/16* (2006.01)
*G01R 15/20* (2006.01)
*G01R 33/09* (2006.01)

(52) U.S. Cl.
CPC ......... *G01R 15/205* (2013.01); *G01R 15/207* (2013.01); *G01R 33/091* (2013.01)

(58) Field of Classification Search
CPC ... G01R 15/205; G01R 33/091; G01R 15/207
(Continued)

(56) References Cited

U.S. PATENT DOCUMENTS

2013/0057266 A1* 3/2013 Nishiyama ........... G01R 15/205
324/225

FOREIGN PATENT DOCUMENTS

JP 2001-281270 A 10/2001
JP 2002-243766 A 8/2002
(Continued)

OTHER PUBLICATIONS

Official Communication issued in International Patent Application No. PCT/JP2015/082235, dated Feb. 9, 2016.

*Primary Examiner* — Farhana Hoque
(74) *Attorney, Agent, or Firm* — Keating & Bennett, LLP

(57) ABSTRACT

A current sensor includes a primary conductor in which a current flows, a magnetic sensor that detects a strength of a magnetic field produced by the current, and a magnetic body that surrounds a periphery of the primary conductor and the magnetic sensor. Output characteristics of the magnetic sensor include a low-output region in which a measured voltage value lower than a virtual output voltage proportional to a value of the current is outputted. Magnetization characteristics of the magnetic body include a magnetic saturation region in which permeability decreases in ranges where an absolute value of the current is no less than a threshold. An output of the magnetic sensor is corrected such that the measured voltage value increases as a result of a magnetic field leaking from the magnetic body that is within the magnetic saturation region acting on the magnetic sensor that is in the low-output region.

20 Claims, 18 Drawing Sheets

(58) Field of Classification Search
USPC .................................................. 324/227, 225
See application file for complete search history.

(56) References Cited

FOREIGN PATENT DOCUMENTS

| | | |
|---|---|---|
| JP | 2009-058451 A | 3/2009 |
| JP | 2010-002277 A | 1/2010 |
| JP | 2011-007685 A | 1/2011 |
| JP | 2012-026966 A | 2/2012 |
| JP | 2013-246005 A | 12/2013 |
| JP | 2015-135288 A | 7/2015 |
| WO | 2011/155261 A1 | 12/2011 |
| WO | 2012/120940 A1 | 9/2012 |

* cited by examiner

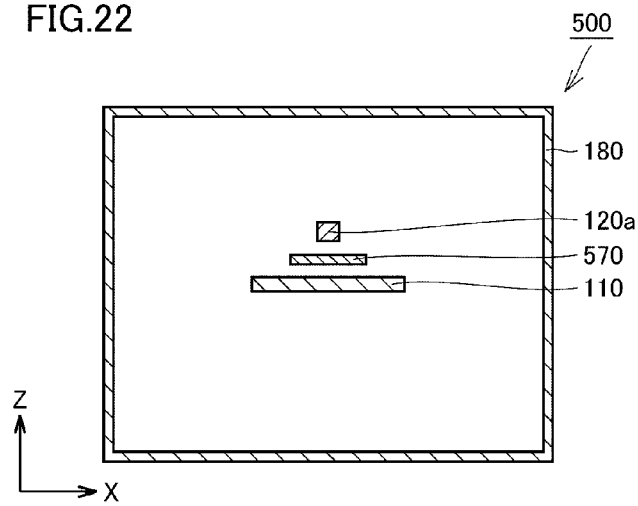
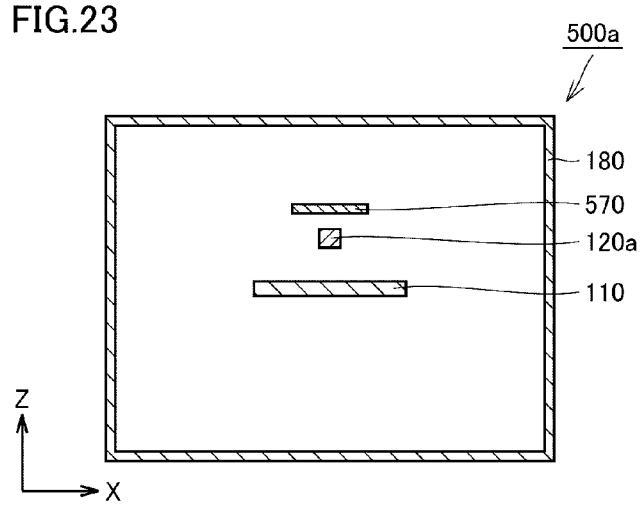

CURRENT SENSOR THAT DETECTS A MAGNETIC FIELD PRODUCED BY A CURRENT

CROSS REFERENCE TO RELATED APPLICATIONS

This application claims the benefit of priority to Japanese Patent Application No. 2014-252877 filed on Dec. 15, 2014 and is a Continuation Application of PCT Application No. PCT/JP2015/082235 filed on Nov. 17, 2015. The entire contents of each application are hereby incorporated herein by reference.

BACKGROUND OF THE INVENTION

1. Field of the Invention

The present invention relates to current sensors, and particularly relates to a current sensor that measures a value of a current by detecting a magnetic field arising as a result of the current.

2. Description of the Related Art

Japanese Unexamined Patent Application Publication No. 2010-2277 and International Publication No. WO 2011/155261 disclose current sensor configurations.

The current sensor disclosed in Japanese Unexamined Patent Application Publication No. 2010-2277 provides a busbar, an insulating substrate, a Hall IC serving as a magnetism detecting element, and a magnetic shielding body for each of a U phase, a V phase, and a W phase. Each magnetic shielding body includes an upper magnetic shielding member and a lower magnetic shielding member, and thus constitutes an annular enclosure part that encloses the corresponding busbar, insulating substrate, and Hall IC in an annular shape. The magnetic shielding body thus blocks magnetism from external magnetic fields. A gap is formed between the upper magnetic shielding member and the lower magnetic shielding member. The position of the gap in a height direction is the same as or similar to the position of the busbar in the height direction, such that the gap is located in an area facing a side surface of the busbar. The Hall IC is disposed above a central area of the busbar.

The current sensor disclosed in International Publication No. WO 2011/155261 is a magnetic balance type current sensor, and includes: a magnetoresistance element whose characteristics change in response to an induced magnetic field from a current to be measured; a feedback coil that is disposed in the vicinity of the magnetoresistance element and generates a canceling magnetic field canceling out the induced magnetic field; a magnetic shield that attenuates the induced magnetic field and enhances the canceling magnetic field; and a hard bias layer, provided on or above the magnetic shield, that suppresses hysteresis in the magnetic shield.

Conventional current sensors are used in linear regions where the density of a magnetic flux detected by a magnetic sensor having a Hall element, a magnetoresistance element, or the like is proportional to an output voltage. In other words, when a conventional current sensor measures a high current that produces a magnetic field exceeding the linear region of the magnetic sensor, measurement error will rise and measurement accuracy will drop.

On the other hand, a current sensor including a magnetic sensor having a wide linear region may be used to measure a high current. However, the magnetic sensor has a low sensitivity in this case, which reduces the measurement accuracy for low currents.

SUMMARY OF THE INVENTION

Preferred embodiments of the present invention provide a current sensor that has a broad measurement range while maintaining good sensitivity.

A current sensor according to a first aspect of preferred embodiments of the present invention includes a primary conductor in which a current to be measured flows, at least one magnetic sensor that detects a strength of a magnetic field produced by the current flowing in the primary conductor, and a magnetic body that surrounds a periphery of the primary conductor and the magnetic sensor. Output characteristics of the magnetic sensor have a low-output region in which a measured voltage value lower than a virtual output voltage proportional to a value of the current is outputted. Magnetization characteristics of the magnetic body include a magnetic saturation region in which permeability decreases in ranges where an absolute value of the current is no less than a threshold. An output of the magnetic sensor is corrected such that the measured voltage value increases as a result of a magnetic field leaking from the magnetic body that is within the magnetic saturation region acting on the magnetic sensor that is in the low-output region.

A current sensor according to a second aspect of preferred embodiments of the present invention includes a primary conductor in which a current to be measured flows, at least one magnetic sensor that detects a strength of a magnetic field produced by the current flowing in the primary conductor, and a magnetic body that surrounds a periphery of the primary conductor and the magnetic sensor. The magnetic body includes a plate that extends along a direction of a detection axis of the magnetic sensor, and opposes the magnetic sensor at a distance from the magnetic sensor. An output voltage of the magnetic sensor is corrected so as to approach a virtual output voltage proportional to a value of the current as a result of a magnetic field leaking from the plate magnetically saturated by a magnetic field produced by the current acting on the magnetic sensor.

According to a preferred embodiment of the present invention, the magnetic body includes a first magnetic body including the plate and a second magnetic body positioned at a distance from the first magnetic body. The first magnetic body is magnetically saturated by the magnetic field produced by the current before the second magnetic body.

According to another preferred embodiment of the present invention, a gap is provided in the second magnetic body, and due to the gap, the second magnetic body is shaped as a tube that is non-continuous in a circumferential direction.

According to another preferred embodiment of the present invention, the second magnetic body is shaped as a tube that is continuous throughout the entire circumference.

According to another preferred embodiment of the present invention, the second magnetic body surrounds a periphery of the first magnetic body.

According to another preferred embodiment of the present invention, the first magnetic body is positioned at the gap of the second magnetic body.

According to another preferred embodiment of the present invention, the first magnetic body includes at least one first magnetic body member. The second magnetic body includes at least one second magnetic body member.

According to another preferred embodiment of the present invention, the first magnetic body member has a plate shape.

According to another preferred embodiment of the present invention, the first magnetic body includes two first magnetic body members. The magnetic sensor is positioned between the two first magnetic body members.

According to another preferred embodiment of the present invention, the primary conductor has a plate shape. The magnetic sensor is capable of detecting a magnetic field in a direction perpendicular or substantially perpendicular to both a thickness direction of the primary conductor and a direction in which the current flows.

According to another preferred embodiment of the present invention, the magnetic sensor is disposed on at least one of one side and another side of the primary conductor in the thickness direction of the primary conductor, in a central area of the primary conductor in the width direction of the primary conductor.

According to another preferred embodiment of the present invention, a first magnetic sensor and a second magnetic sensor are included as the magnetic sensor. The first magnetic sensor and the second magnetic sensor are positioned opposite to each other with the primary conductor interposed therebetween.

According to another preferred embodiment of the present invention, the current sensor further includes a calculator that calculates the value of the current by processing a detection value of the first magnetic sensor and a detection value of the second magnetic sensor. The detection value of the first magnetic sensor and the detection value of the second magnetic sensor have opposite phases with respect to the strength of the magnetic field produced by the current flowing in the primary conductor. The calculator preferably is a subtractor or a differential amplifier, for example.

According to another preferred embodiment of the present invention, the current sensor further includes a calculator that calculates the value of the current by processing a detection value of the first magnetic sensor and a detection value of the second magnetic sensor. The detection value of the first magnetic sensor and the detection value of the second magnetic sensor have the same phase with respect to the strength of the magnetic field produced by the current flowing in the primary conductor. The calculator preferably is an adder or a summing amplifier, for example.

According to various preferred embodiments of the present invention, the measurement range of a current sensor is able to be broadened while maintaining good sensitivity.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 22 is a cross-sectional view illustrating the configuration of a current sensor according to a fifth preferred embodiment of the present invention.

FIG. 23 is a cross-sectional view illustrating the configuration of a current sensor according to a first variation on the fifth preferred embodiment of the present invention.

DETAILED DESCRIPTION OF THE PREFERRED EMBODIMENTS

Figure 1:
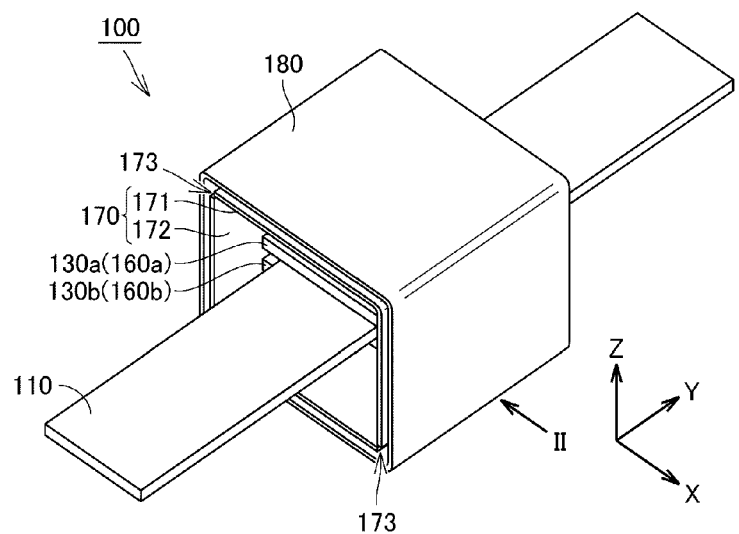
FIG. 1 is a perspective view illustrating the external appearance of a current sensor according to a first preferred embodiment of the present invention.

Hereinafter, current sensors according to preferred embodiments of the present invention will be described with reference to the drawings. In the following descriptions of the preferred embodiments, identical or corresponding elements in the drawings will be given the same reference numerals and descriptions thereof will not be repeated.

First Preferred Embodiment

Figure 2:
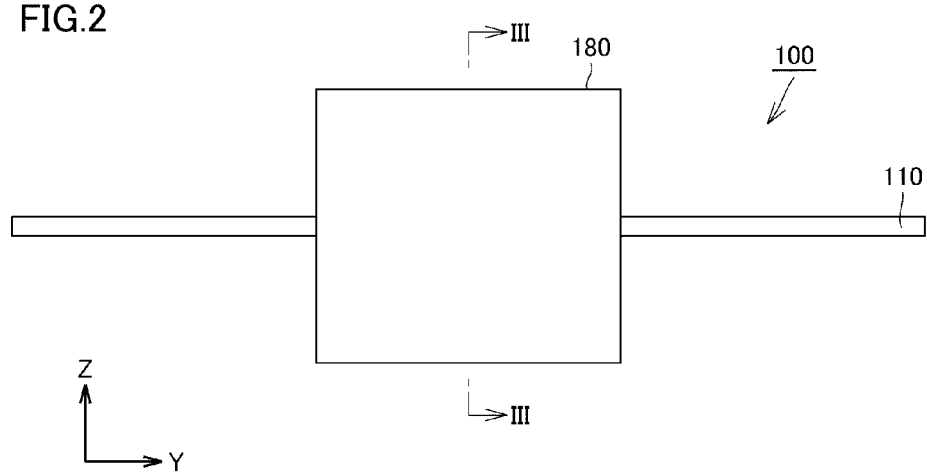
FIG. 2 is a side view illustrating the current sensor of FIG. 1 from the direction of an arrow II.
Figure 3:
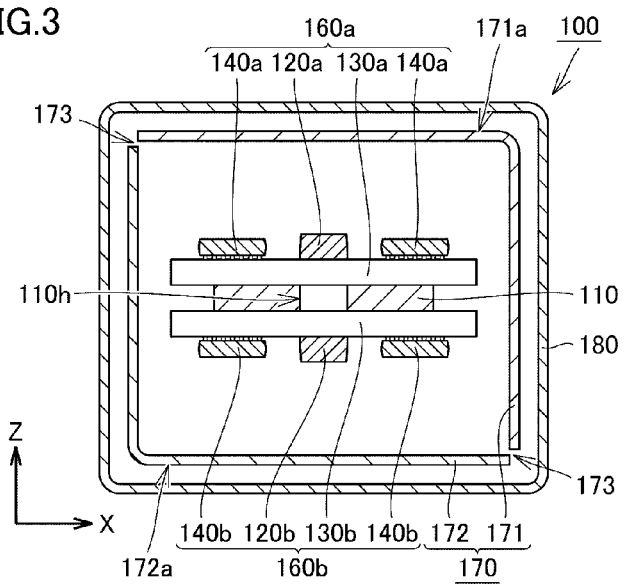
FIG. 3 is a cross-sectional view illustrating the current sensor of FIG. 2 from the direction of the arrows on a line III-III.
Figure 4:
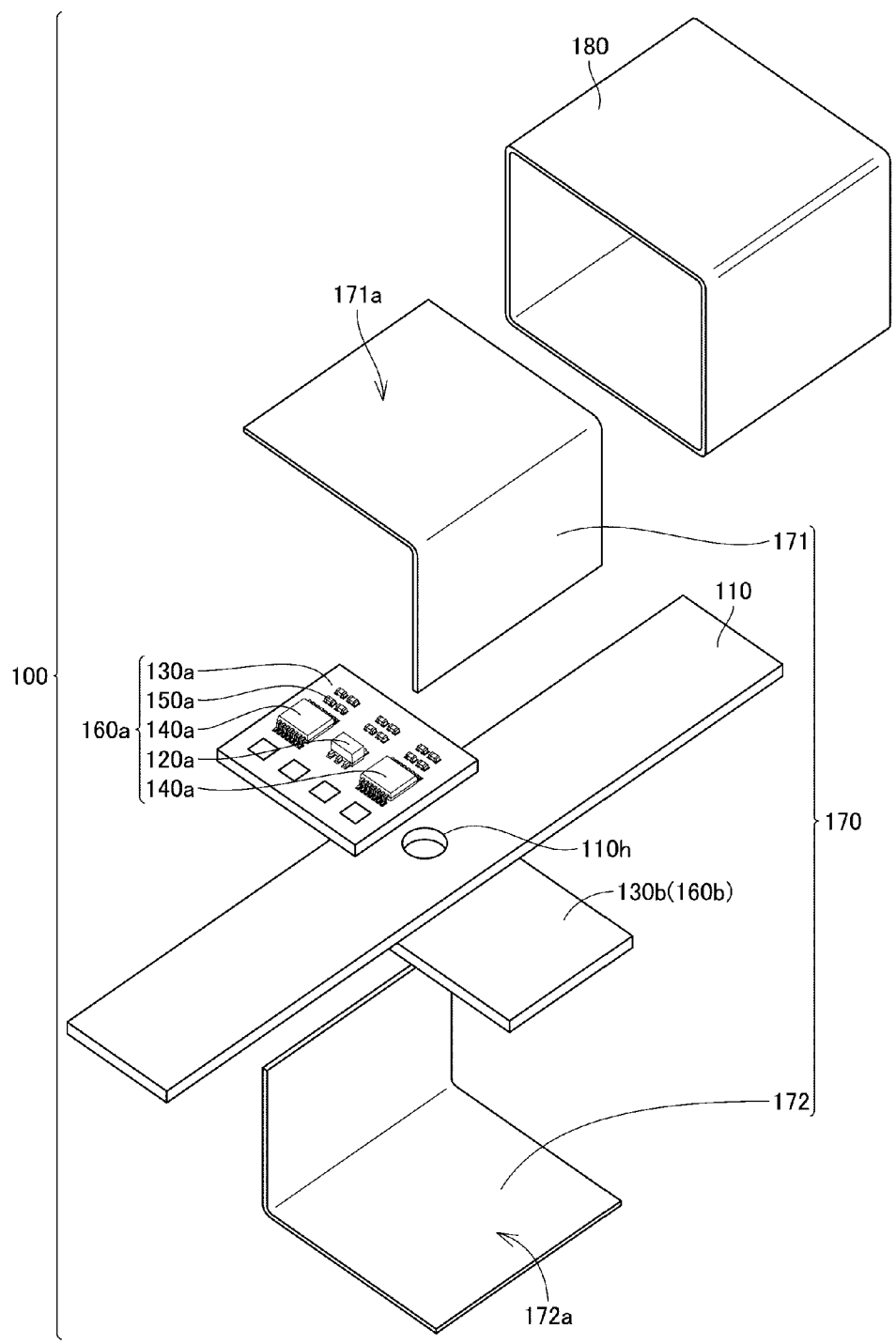
FIG. 4 is an exploded perspective view illustrating the configuration of the current sensor according to the first preferred embodiment of the present invention.
Figure 5:
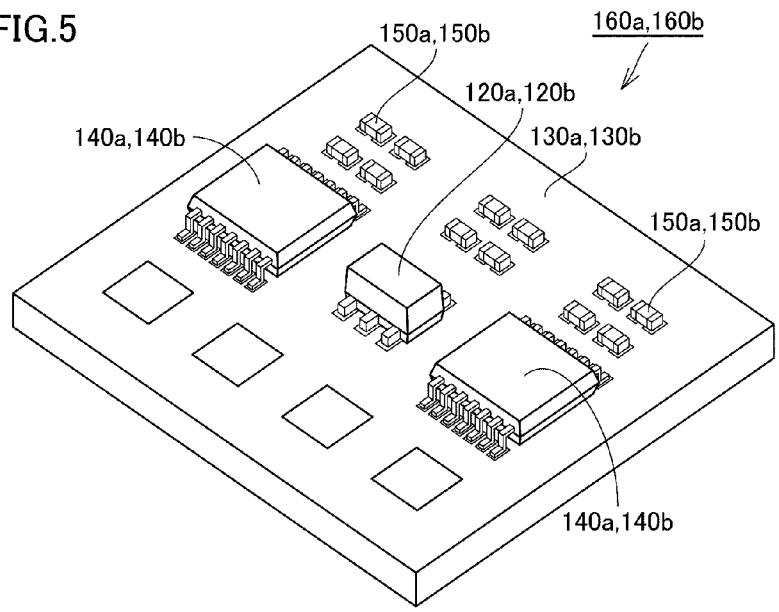
FIG. 5 is a perspective view illustrating the external appearance of a circuit board in the current sensor according to the first preferred embodiment of the present invention.
Figure 6:
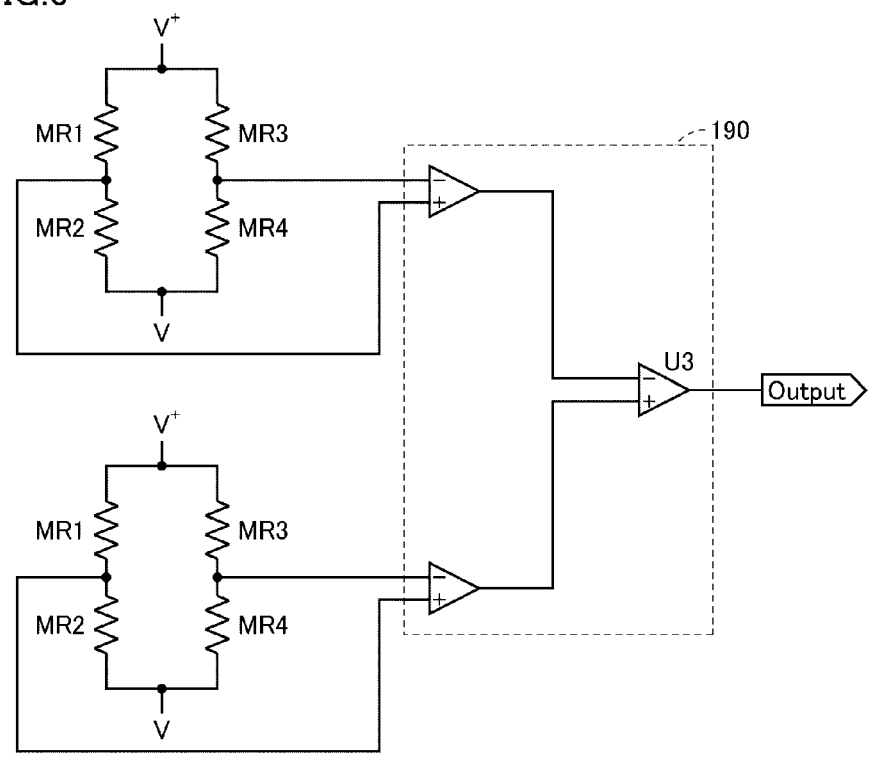
FIG. 6 is a circuit diagram illustrating the circuit configuration of the current sensor according to the first preferred embodiment of the present invention.

FIG. 1 is a perspective view illustrating the external appearance of a current sensor according to a first preferred embodiment of the present invention. FIG. 2 is a side view illustrating the current sensor of FIG. 1 from the direction of an arrow II. FIG. 3 is a cross-sectional view illustrating the current sensor of FIG. 2 from the direction of the arrows on a line III-III. FIG. 4 is an exploded perspective view illustrating the configuration of the current sensor according to the first preferred embodiment of the present invention. FIG. 5 is a perspective view illustrating the external appearance of a circuit board in the current sensor according to the first preferred embodiment of the present invention. FIG. 6 is a circuit diagram illustrating the circuit configuration of the current sensor according to the first preferred embodiment of the present invention. In FIGS. 1 to 3, a width direction of a primary conductor 110 (mentioned later) corresponds to an X-axis direction, a length direction of the primary conductor 110 corresponds to a Y-axis direction, and a thickness direction of the primary conductor 110 corresponds to a Z-axis direction.

As illustrated in FIGS. 1 to 6, a current sensor 100 according to the first preferred embodiment of the present invention includes the primary conductor 110, in which a current to be measured flows, and two magnetic sensors that detect the strength of a magnetic field produced by the current flowing in the primary conductor 110. The two magnetic sensors include a first magnetic sensor 120a and a second magnetic sensor 120b. Although the current sensor 100 includes two magnetic sensors in the present preferred embodiment, the number of magnetic sensors is not limited to two, and it is sufficient for at least one magnetic sensor to be provided.

The current sensor 100 further includes a first magnetic body 170 that surrounds the periphery of the primary conductor 110 and the two magnetic sensors, and a second magnetic body 180 that surrounds the periphery of the first magnetic body 170. Gaps 173 are provided in the first magnetic body 170, and due to the gaps 173, the first magnetic body 170 is shaped as a tube that is non-continuous in the circumferential direction. The first magnetic body 170 includes plates, which will be described later. The second magnetic body 180 is positioned at a distance from the first magnetic body 170.

In the present preferred embodiment, the first magnetic body 170 includes two first magnetic body members 171 and 172. However, the configuration of the first magnetic body 170 is not limited thereto, and it is sufficient for the first magnetic body 170 to include at least one first magnetic body member. Viewed from the direction in which current flows in the primary conductor 110 (the Y-axis direction), the two first magnetic body members 171 and 172 preferably are rectangular or substantially rectangular, with the gaps 173 provided between end portions of the members, and surround the periphery of the primary conductor 110 and the two magnetic sensors. Specifically, the two first magnetic body members 171 and 172 surround the periphery of a first circuit board 160a, a second circuit board 160b (these will be described later), and a portion of the primary conductor 110 interposed between the first circuit board 160a and the second circuit board 160b while being distanced therefrom.

In the present preferred embodiment, the second magnetic body 180 is shaped as a tube that is continuous throughout the entire circumference thereof. The second magnetic body 180 includes a single second magnetic body member. However, the configuration of the second magnetic body 180 is not limited thereto, and it is sufficient for the second magnetic body 180 to include at least one second magnetic body member. Viewed from the direction in which current flows in the primary conductor 110 (the Y-axis direction), the second magnetic body member preferably is rectangular or substantially rectangular and surrounds the periphery of the two first magnetic body members 171 and 172 while being distanced therefrom.

As will be described later, the first magnetic body 170 is magnetically saturated by a magnetic field produced by current flowing in the primary conductor 110 before the second magnetic body 180.

The relative positions of the primary conductor 110, the first circuit board 160a, the second circuit board 160b, the two first magnetic body members 171 and 172, and the second magnetic body member are fixed by a case or the like (not illustrated). The case is preferably made of an engineering plastic or the like that can withstand high temperatures, such as polyphenylene sulfide, for example. In the case where the first circuit board 160a and the second circuit board 160b are fastened to the case by screws, for example, it is preferable that the boards are fastened by the screws made of a non-magnetic material so as not to disrupt magnetic fields.

The various structural elements will be described in detail hereinafter.

In the present preferred embodiment, the primary conductor 110 has a plate shape. A single penetrating portion is provided in the primary conductor 110 penetrating from a front surface to a rear surface of the primary conductor 110. Specifically, a through-hole 110h that is circular or substantially circular when viewed in plan view is provided in a central area of the primary conductor 110 in the width direction thereof. However, it is not absolutely necessary for a penetrating portion to be provided in the primary conductor 110. Current flows in the primary conductor 110 in the Y-axis direction.

In the present preferred embodiment, the primary conductor 110 is preferably made of copper. However, the material of the primary conductor 110 is not limited thereto, and the primary conductor 110 may be made of a metal such as silver or aluminum, or an alloy containing such metals. The primary conductor 110 may be subjected to a surface treatment. For example, at least one plating layer made of a metal such as nickel, tin, silver, or copper, or an alloy containing such metals, may be provided on the surface of the primary conductor 110.

In the present preferred embodiment, the primary conductor 110 is preferably formed by press-machining a thin plate. However, the method of forming the primary conductor 110 is not limited thereto, and the primary conductor 110 may be formed using a method such as cutting, forging, or casting.

In the present preferred embodiment, the first magnetic sensor 120a is mounted on a first printed board 130a along with a first op-amp 140a and a first passive element 150a. The first magnetic sensor 120a is disposed in the center of the first printed board 130a. The first magnetic sensor 120a, the first printed board 130a, the first op-amp 140a, and the first passive element 150a define the first circuit board 160a. The first printed board 130a includes a substrate made from glass epoxy or alumina, and interconnects formed by patterning a metal foil such as copper foil on the substrate. A processing circuit that processes signals from the first magnetic sensor 120a is provided in the first circuit board 160a.

The second magnetic sensor 120b is mounted on a second printed board 130b along with a second op-amp 140b and a second passive element 150b. The second magnetic sensor 120b is disposed in the center of the second printed board 130b. The second magnetic sensor 120b, the second printed board 130b, the second op-amp 140b, and the second passive element 150b constitute the second circuit board 160b. The second printed board 130b includes a substrate made from glass epoxy or alumina, and interconnects preferably formed by patterning a metal foil such as copper foil on the substrate. A processing circuit that processes signals from the second magnetic sensor 120b is provided in the second circuit board 160b.

The first circuit board 160a is mounted on the front surface of the primary conductor 110. The first magnetic sensor 120a is positioned directly above the through-hole 110h, with the first printed board 130a interposed between the first magnetic sensor 120a and the primary conductor 110. The second circuit board 160b is disposed on the rear surface of the primary conductor 110. The second magnetic sensor 120b is positioned directly below the through-hole 110h, with the second printed board 130b interposed between the second magnetic sensor 120b and the primary conductor 110.

In other words, the first magnetic sensor 120a and the second magnetic sensor 120b are positioned opposite to each other with the primary conductor 110 interposed therebetween. The first magnetic sensor 120a is disposed on one side of the primary conductor 110 in the thickness direction (the Z-axis direction) thereof (that is, on an upper side), in a central area of the primary conductor 110 in the width direction thereof (the X-axis direction). The second magnetic sensor 120b is disposed on another side of the primary conductor 110 in the thickness direction (the Z-axis direction) thereof (that is, on a lower side), in a central area of the primary conductor 110 in the width direction thereof (the X-axis direction).

A direction of detection axes of the first magnetic sensor 120a and the second magnetic sensor 120b (a magnetism sensing direction) corresponds to the width direction of the primary conductor 110 (the X-axis direction). In other words, the first magnetic sensor 120a and the second magnetic sensor 120b each is able to detect a magnetic field in a direction (the X-axis direction) perpendicular or substantially perpendicular to the thickness direction of the primary conductor 110 (the Z-axis direction) and the direction in which current flows in the primary conductor 110 (the Y-axis direction).

The first magnetic sensor 120a and the second magnetic sensor 120b each has input/output characteristics of outputting a positive value in the case of detecting a magnetic field oriented in one direction of the detection axis and outputting a negative value in the case of detecting a magnetic field oriented in the direction opposite from the one direction of the detection axis.

The first magnetic sensor 120a and the second magnetic sensor 120b each includes a Wheatstone bridge circuit including four anisotropic magnetoresistance (AMR) elements. Note that the first magnetic sensor 120a and the second magnetic sensor 120b may include magnetoresistance elements such as giant magnetoresistance (GMR), tunnel magnetoresistance (TMR), ballistic magnetoresistance (BMR), or colossal magnetoresistance (CMR) instead of AMR elements. The first magnetic sensor 120a and the second magnetic sensor 120b may each include a half-bridge circuit including two magnetoresistance elements. In addition to these, a magnetic sensor having a Hall element, a magnetic sensor including a magneto impedance (MI) element that uses a magneto impedance effect, or a fluxgate-type magnetic sensor can also be used as the first magnetic sensor 120a and the second magnetic sensor 120b. Magnetism elements such as magnetoresistance elements or Hall elements may be provided in a resin package, or may be potted using a silicone resin, epoxy resin, or the like.

Each AMR element in the first magnetic sensor 120a and the second magnetic sensor 120b includes a barber pole electrode, and thus has odd function input/output characteristics. To be more specific, by including a barber pole electrode, each AMR element in the first magnetic sensor 120a and the second magnetic sensor 120b is biased such that current flows at a predetermined angle. The magnetization direction of magnetoresistance films of the AMR elements in the first magnetic sensor 120a is the same direction as the magnetization direction of the magnetoresistance films of the AMR elements in the second magnetic sensor 120b. This makes it possible to reduce or prevent a decrease in output accuracy caused by the influence of external magnetic fields.

As illustrated in FIG. 6, the current sensor 100 includes a calculator 190 that calculates a value of current flowing in the primary conductor 110 by processing a detection value of the first magnetic sensor 120a and a detection value of the second magnetic sensor 120b. The calculator 190 preferably is a differential amplifier. However, the calculator 190 may be a subtractor.

As illustrated in FIGS. 1, 3, and 4, viewed from the direction in which current flows in the primary conductor 110 (the Y-axis direction), the two first magnetic body members 171 and 172 have L shapes. The two first magnetic body members 171 and 172 include first plates 171a and 172a, respectively, and second plates that are perpendicular or substantially perpendicular to the first plates 171a and 172a. The first plates 171a and 172a of the two first magnetic body members 171 and 172, respectively, are parallel or substantially parallel to the primary conductor 110.

In other words, the first plate 171a of the first magnetic body member 171 extends along the direction of the detection axis of the first magnetic sensor 120a (that is, along the magnetism sensing direction), and opposes the first magnetic sensor 120a at a distance from the first magnetic sensor 120a. The first plate 172a of the first magnetic body member 172 extends along the direction of the detection axis of the second magnetic sensor 120b (that is, along the magnetism sensing direction), and opposes the second magnetic sensor 120b at a distance from the second magnetic sensor 120b.

Each of the two gaps 173 extends from one end portion to another end portion of the first magnetic body 170 in the direction in which current flows in the primary conductor 110 (the Y-axis direction). Viewed from the direction in which current flows in the primary conductor 110 (the Y-axis direction), the two gaps 173 are located at opposite corners of the rectangle defined by the first magnetic body members 171 and 172. Viewed from the direction in which current flows in the primary conductor 110 (the Y-axis direction), the position of the center of the rectangle defined by the first magnetic body members 171 and 172 overlaps with the position of the through-hole 110h in the primary conductor 110.

The first magnetic body members 171 and 172 are preferably made of PC permalloy. The second magnetic body member is preferably made of PC permalloy. PC permalloy is an alloy with approximately 80% Ni content, with the rest being mainly Fe. The materials of the first magnetic body members 171 and 172 and the second magnetic body member are selected such that the first magnetic body 170 is magnetically saturated by a magnetic field produced by current flowing in the primary conductor 110 before the second magnetic body 180. The materials of the first magnetic body members 171 and 172 and the second magnetic body member are not limited to those described above, however. A magnetic material exhibiting high permeability and saturation magnetic flux density is preferable, such as soft steel, silicon steel, electromagnetic steel, PB permalloy, PC permalloy, nickel alloy, iron alloy, or ferrite. PB permalloy is an alloy with approximately 45% Ni content, with the rest being mainly Fe.

In the present preferred embodiment, the first magnetic body members 171 and 172 and the second magnetic body member are preferably formed by press-machining a thin plate. However, the method of forming the first magnetic body members 171 and 172 and the second magnetic body member is not limited thereto, and the first magnetic body members 171 and 172 and the second magnetic body member may be formed using a method such as cutting, forging, or casting.

Preferably, the space between the first magnetic body members 171 and 172 and the second magnetic body member is filled with a material having a relative permeability near 1. Specifically, the space is preferably filled with a resin, an inorganic material, a ceramic material, a composite material thereof, air, or the like. Polyphenylene sulfide resin, polybutylene terephthalate resin, a liquid-crystal polymer, a polyamide-based resin, an epoxy resin, a phenol resin, or the like can be used as the resin. Glass or the like can be used as the inorganic material. Alumina, steatite, or the like can be used as the ceramic material.

Next, descriptions will be given of the results of a simulation-based analysis of a relationship between a magnetic flux density and a distance from a front surface 110s or a rear surface 110t of the primary conductor 110 at a position directly above or directly below the central area of the primary conductor 110 in the width direction thereof (the X-axis direction), carried out for a primary conductor 110 according to a first comparative example in which a penetrating portion is not provided, and a primary conductor 110 according to a first working example in which the through-hole 110h is provided.

Figure 7:
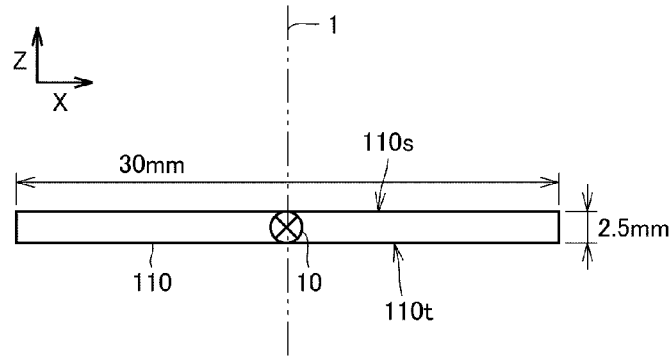
FIG. 7 is a cross-sectional view illustrating the horizontal cross-sectional shape of a primary conductor according to a first comparative example.
Figure 8:
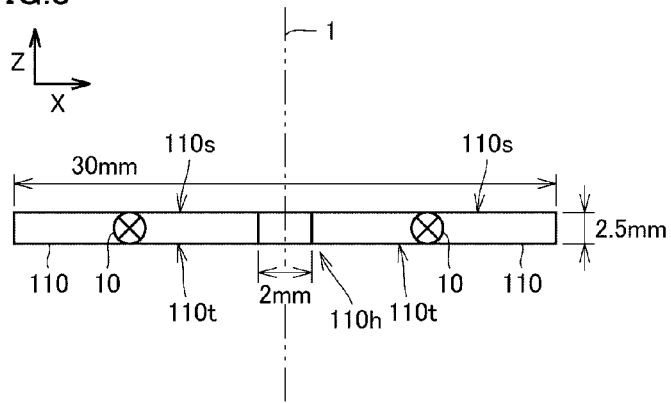
FIG. 8 is a cross-sectional view illustrating the horizontal cross-sectional shape of a primary conductor according to a first working example.

FIG. 7 is a cross-sectional view illustrating the horizontal cross-sectional shape of the primary conductor according to the first comparative example. FIG. 8 is a cross-sectional view illustrating the horizontal cross-sectional shape of the primary conductor according to the first working example. As illustrated in FIGS. 7 and 8, the outer dimensions of the horizontal cross-section of the primary conductor 110 were a width of 30 mm and a thickness of 2.5 mm in both the first comparative example and the first working example. The through-hole 110h, having a diameter of 2 mm, was provided in the central area of the primary conductor 110 according to the first working example, in the width direction thereof. The value of current flowing in the primary conductor 110 was set to 100 A in both the first comparative example and the first working example, and as illustrated in FIGS. 7 and 8, a magnetic flux density distribution on a reference line 1 located directly above or directly below the central area of the primary conductor 110 in the width direction thereof was calculated through simulation-based analysis. Note that in the first comparative example and the first working example, neither the first magnetic body members 171 and 172 nor the second magnetic body member are provided.

Figure 9:
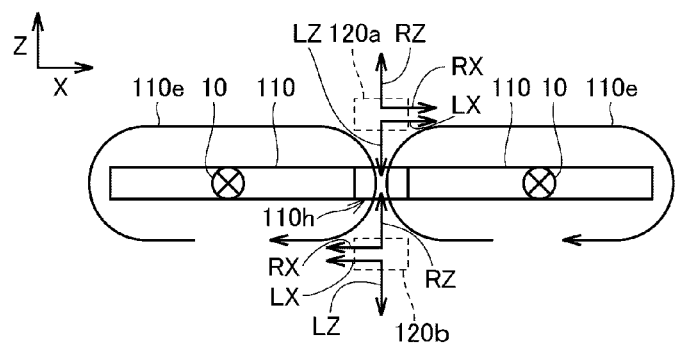
FIG. 9 is a cross-sectional view schematically illustrating a magnetic field arising in the periphery of the primary conductor according to the first working example.
Figure 10:
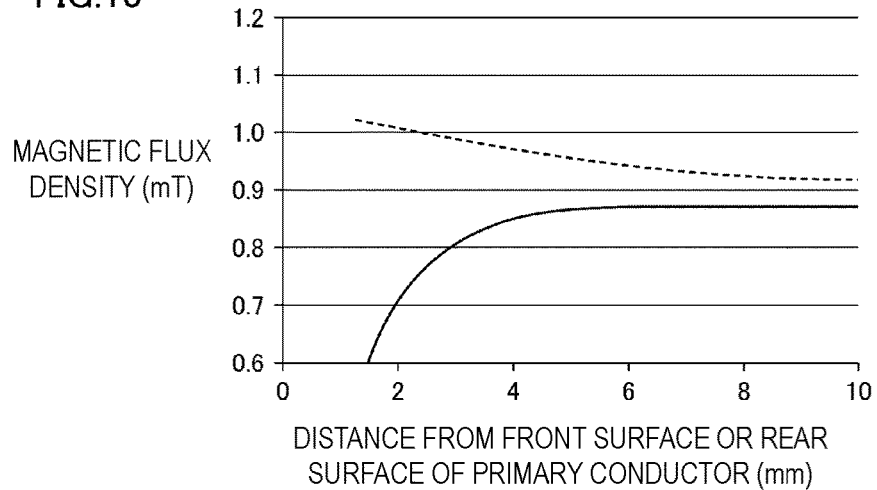
FIG. 10 is a graph illustrating a relationship between a distance from a front surface or a rear surface of the primary conductor and a magnetic flux density in a width direction (X-axis direction) of the primary conductor, at a reference line located directly above or directly below a central area, in a width direction, of the primary conductor, for the primary conductors according to the first comparative example and the first working example.

FIG. 9 is a cross-sectional view schematically illustrating a magnetic field arising in the periphery of the primary conductor according to the first working example. FIG. 9 uses the same cross-sectional view as that illustrated in FIG. 8. FIG. 10 is a graph illustrating a relationship between the distance from the front surface or the rear surface of the primary conductor and the magnetic flux density in the width direction (the X-axis direction) of the primary conductor, at the reference line located directly above or directly below the central area, in a width direction, of the primary conductor, for the primary conductors according to the first comparative example and the first working example. In FIG. 10, the vertical axis represents the magnetic flux density (mT), whereas the horizontal axis represents the distance (mm) from the front surface 110s or the rear surface 110t of the primary conductor 110. Furthermore, in FIG. 10, the solid line indicates data for the primary conductor 110 according to the first working example, whereas the broken line indicates data for the primary conductor 110 according to the first comparative example.

As illustrated in FIG. 9, due to what is known as the corkscrew rule, a magnetic field 110e is produced by current 10 flowing in the primary conductor 110 located to the left of the through-hole 110h. Likewise, a magnetic field 110e is produced by current 10 flowing in the primary conductor 110 located to the right of the through-hole 110*h*.

At the reference line 1 located directly above the central area of the primary conductor 110 in the width direction thereof, a magnetic flux density LZ in the Z-axis direction resulting from the magnetic field 110*e* produced by the current 10 flowing in the primary conductor 110 located to the left of the through-hole 110*h* and a magnetic flux density RZ in the Z-axis direction resulting from the magnetic field 110*e* produced by the current 10 flowing in the primary conductor 110 located to the right of the through-hole 110*h* cancel each other out. On the other hand, a magnetic flux density LX in the X-axis direction resulting from the magnetic field 110*e* produced by the current 10 flowing in the primary conductor 110 located to the left of the through-hole 110*h* and a magnetic flux density RX in the X-axis direction resulting from the magnetic field 110*e* produced by the current 10 flowing in the primary conductor 110 located to the right of the through-hole 110*h* combine.

At the reference line 1 located directly below the central area of the primary conductor 110 in the width direction thereof, the magnetic flux density LZ in the Z-axis direction resulting from the magnetic field 110*e* produced by the current 10 flowing in the primary conductor 110 located to the left of the through-hole 110*h* and the magnetic flux density RZ in the Z-axis direction resulting from the magnetic field 110*e* produced by the current 10 flowing in the primary conductor 110 located to the right of the through-hole 110*h* cancel each other out. On the other hand, the magnetic flux density LX in the X-axis direction resulting from the magnetic field 110*e* produced by the current 10 flowing in the primary conductor 110 located to the left of the through-hole 110*h* and the magnetic flux density RX in the X-axis direction resulting from the magnetic field 110*e* produced by the current 10 flowing in the primary conductor 110 located to the right of the through-hole 110*h* combine.

As indicated in FIG. 10, according to the first comparative example, the magnetic flux density in the X-axis direction at the reference line 1 located directly above the central area of the primary conductor 110 in the width direction thereof decreases as the distance from the front surface 110*s* of the primary conductor 110 increases. On the other hand, according to the first working example, the magnetic flux density in the X-axis direction at the reference line 1 located directly above the central area of the primary conductor 110 in the width direction thereof increases as the distance from the front surface 110*s* of the primary conductor 110 increases, up to a distance of 4 mm, and stays substantially constant at distances no less than 4 mm and no greater than 10 mm from the front surface 110*s* of the primary conductor 110.

Additionally, the magnetic flux density in the X-axis direction at the reference line 1 located directly above the central area of the primary conductor 110 in the width direction thereof according to the first working example is lower than the magnetic flux density in the X-axis direction at the reference line 1 located directly above the central area of the primary conductor 110 in the width direction thereof according to the comparative example, regardless of the distance from the front surface 110*s* of the primary conductor 110. This is because current does not flow in the portion corresponding to the through-hole 110*h*.

Likewise, according to the first comparative example, the magnetic flux density in the X-axis direction at the reference line 1 located directly below the central area of the primary conductor 110 in the width direction thereof decreases as the distance from the rear surface 110*t* of the primary conductor 110 increases. On the other hand, according to the first working example, the magnetic flux density in the X-axis direction at the reference line 1 located directly below the central area of the primary conductor 110 in the width direction thereof increases as the distance from the rear surface 110*t* of the primary conductor 110 increases, up to a distance of 4 mm, and stays substantially constant at distances no less than 4 mm and no greater than 10 mm from the rear surface 110*t* of the primary conductor 110.

Additionally, the magnetic flux density in the X-axis direction at the reference line 1 located directly below the central area of the primary conductor 110 in the width direction thereof according to the first working example is lower than the magnetic flux density in the X-axis direction at the reference line 1 located directly below the central area of the primary conductor 110 in the width direction thereof according to the comparative example, regardless of the distance from the rear surface 110*t* of the primary conductor 110. This is because current does not flow in the portion corresponding to the through-hole 110*h*.

As is clear from the results of this simulation-based analysis, with the current sensor 100 according to the present preferred embodiment, providing the first magnetic sensor 120*a* in a position directly above the through-hole 110*h* in the primary conductor 110 makes it possible to significantly reduce the density of the magnetic flux acting on the first magnetic sensor 120*a*. As such, saturation of the output of the magnetoresistance element in the first magnetic sensor 120*a* is able to be significantly reduced or prevented even in cases where a high current flows in the primary conductor 110.

Likewise, providing the second magnetic sensor 120*b* in a position directly below the through-hole 110*h* in the primary conductor 110 makes it possible to significantly reduce the density of the magnetic flux acting on the second magnetic sensor 120*b*. As such, saturation of the output of the magnetoresistance element in the second magnetic sensor 120*b* is able to be significantly reduced or prevented even in cases where a high current flows in the primary conductor 110.

With the current sensor 100 according to the present preferred embodiment, the density of the magnetic fluxes acting on the magnetoresistance elements is able to be significantly reduced using the simple configuration of providing the through-hole 110*h* in the primary conductor 110, without using a complicated circuit. It is thus possible to expand the input dynamic range of the current sensor 100, which enables the current sensor 100 to correctly measure high currents.

Additionally, disposing the first magnetic sensor 120*a* in a position directly above the through-hole 110*h* in the primary conductor 110 and disposing the second magnetic sensor 120*b* in a position directly below the through-hole 110*h* in the primary conductor 110 make it possible to reduce the densities of the magnetic fluxes in the X-axis direction and the Z-axis direction acting on the first magnetic sensor 120*a* and the second magnetic sensor 120*b*. This in turn makes it possible to significantly reduce or prevent variations in the strengths of the magnetic fields acting on the first magnetic sensor 120*a* and the second magnetic sensor 120*b*. The current sensor 100 is therefore able to reliably and accurately measure the magnitude of a current to be measured.

As described above, according to the first working example, a position, at the reference line 1 located directly above or directly below the central area of the primary conductor 110 in the width direction thereof, no less than 4 mm and no greater than 10 mm from the front surface 110*s* or the rear surface 110*t* of the primary conductor 110 is a robust region in which the magnetic flux density in the X-axis direction is substantially constant.

In the current sensor 100 according to the present preferred embodiment, the first magnetic sensor 120*a* preferably is disposed in a position directly above the through-hole 110*h*, with the first printed board 130*a* interposed between the first magnetic sensor 120*a* and the primary conductor 110. As such, the first magnetic sensor 120*a* is located within the robust region. In other words, the thickness of the first printed board 130*a* is set as appropriate such that the first magnetic sensor 120*a* is located within the robust region.

Likewise, in the current sensor 100, the second magnetic sensor 120*b* is disposed in a position directly below the through-hole 110*h*, with the second printed board 130*b* interposed between the second magnetic sensor 120*b* and the primary conductor 110. As such, the second magnetic sensor 120*b* is located within the robust region. In other words, the thickness of the second printed board 130*b* is set as appropriate such that the second magnetic sensor 120*b* is located within the robust region.

Positioning both the first magnetic sensor 120*a* and the second magnetic sensor 120*b* within the robust region makes it possible to reliably reduce or prevent variations in the strength of the magnetic fields acting on the first magnetic sensor 120*a* and the second magnetic sensor 120*b*. The current sensor 100 is therefore able to even more reliably and accurately measure the magnitude of a current to be measured. Note that a robust region is able to be similarly formed by using a drawing process or the like to provide a recessed portion in the primary conductor 110, rather than providing the through-hole 110*h*.

Figure 11:
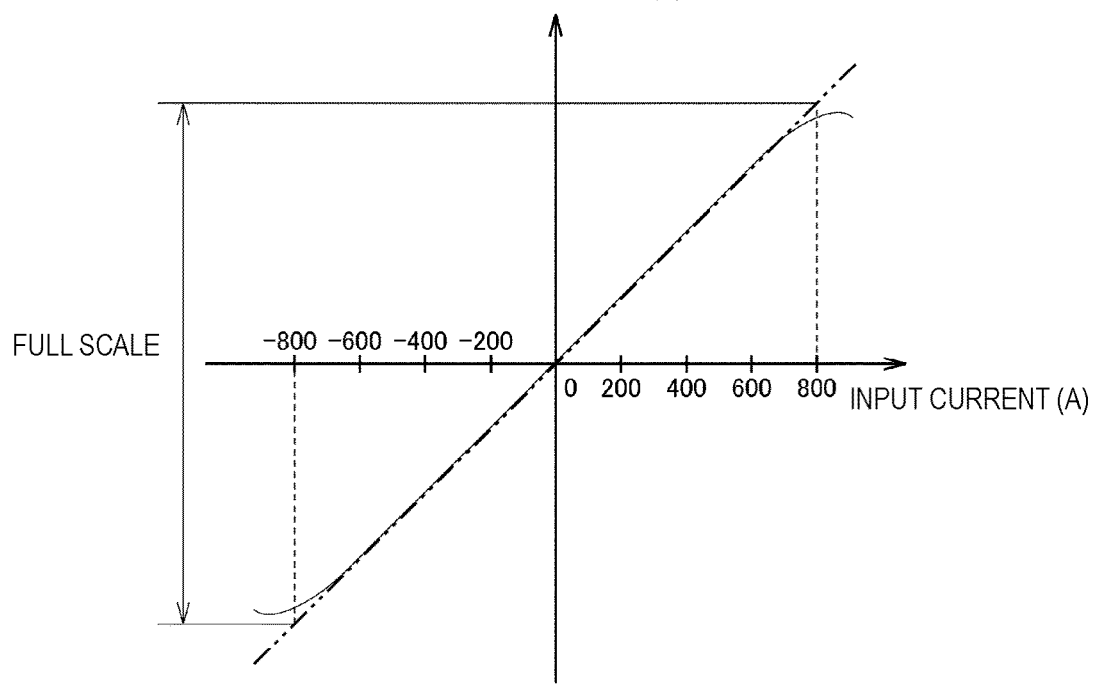
FIG. 11 is a graph illustrating output characteristics of a conventional current sensor.

Output characteristics of a conventional current sensor will be described next. FIG. 11 is a graph illustrating output characteristics of a conventional current sensor. In FIG. 11, the vertical axis represents an output voltage V (V), and the horizontal axis represents an input current I (A). Additionally, in FIG. 11, the double-dot-dash line indicates virtual output voltages obtained through a linear approximation of output voltages in an input current measurable range of the current sensor 100. To be more specific, the virtual output voltages are obtained by approximating input current values and output voltage values with a linear function using the least-squares method.

The input current measurable range of the current sensor 100 according to the present preferred embodiment is ±800 A. Error between the output voltages and the virtual output voltages is within a permissible range within the input current measurable range. The permissible range of error between the output voltages and the virtual output voltages is determined as appropriate in accordance with the measurement accuracy required for the current sensor. With the conventional current sensor, the error between the output voltages and the virtual output voltages increases and exceeds the permissible range both when the input current is near +800 A and near −800 A, as indicated in FIG. 11.

An error rate of the output of a current sensor will now be defined.

The error rate of the output of a current sensor is defined as the percentage of a difference between the output voltage and the virtual output voltage relative to a full scale, which is an interval between a maximum value and a minimum value of the virtual output voltage in the input current measurable range of the current sensor.

For example, assuming the input current measurable range is ±800 A, the virtual output voltage is 2.0 V when the input current is 800 A, and the virtual output voltage is −2.0 V when the input current is −800 A, the full scale is 4.0 V. In the case where the output voltage is 1.48 V and the virtual output voltage is 1.5 V when the input current is 600 A, the error rate of the output of the current sensor is (1.48−1.5)/4.0×100=−0.5%.

The error rate of the output of the current sensor as defined above is determined by the characteristics of the magnetic sensors and the magnetic bodies included in the current sensor. The inventors of preferred embodiments of the present invention discovered that by implementing a favorable combination of magnetic sensor output characteristics and magnetic body magnetization characteristics, the input current measurable range is able to be broadened while reducing the output error rate of the current sensor.

A specific method for implementing a favorable combination of magnetic sensor output characteristics and magnetic body magnetization characteristics will be described next.

Figure 12:
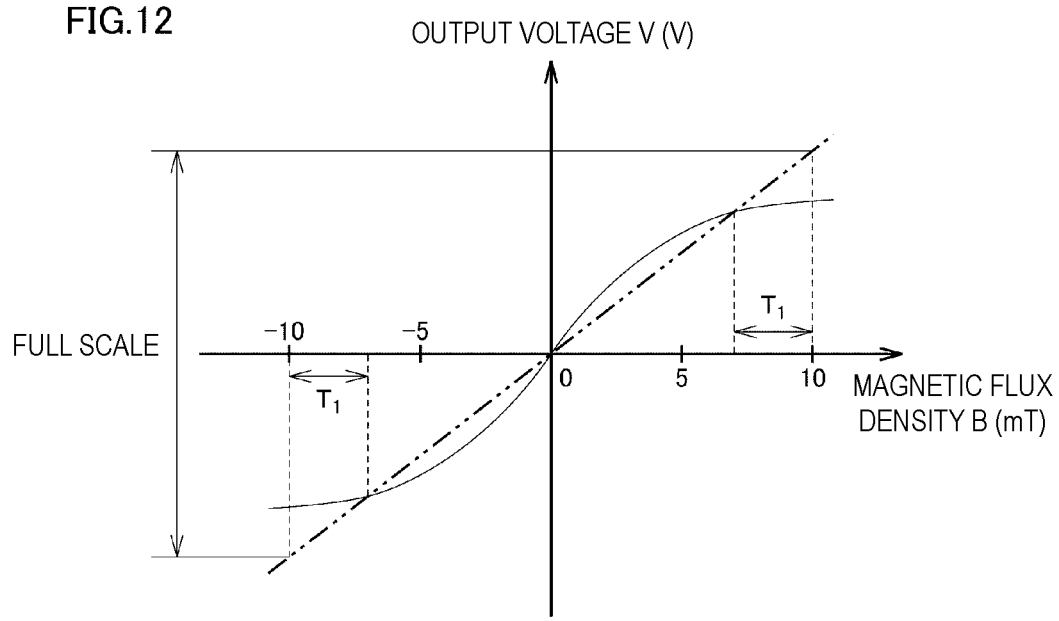
FIG. 12 is a graph illustrating output characteristics of a magnetic sensor included in the current sensor according to the first preferred embodiment of the present invention.

FIG. 12 is a graph illustrating the output characteristics of the magnetic sensors included in the current sensor according to the present preferred embodiment. In FIG. 12, the vertical axis represents the output voltage V (V), and the horizontal axis represents a magnetic flux density B (mT). Additionally, in FIG. 12, the double-dot-dash line indicates virtual output voltages obtained through a linear approximation of output voltages in a magnetic flux density range of the magnetic fields acting on the first and second magnetic sensors 120*a* and 120*b*, corresponding to the input current measurable range of the current sensor 100. To be more specific, the virtual output voltage is obtained by approximating magnetic flux densities and output voltage values with a linear function using the least-squares method. Note that FIG. 12 indicates the output characteristics of the magnetic sensors alone, and does not include the effects of the magnetic bodies on the magnetic flux density.

When the input current of the current sensor 100 is 800 A, the magnetic flux density of the magnetic field acting on the first and second magnetic sensors 120*a* and 120*b* is 10 mT, whereas when the input current of the current sensor 100 is −800 A, the magnetic flux density of the magnetic field acting on the first and second magnetic sensors 120*a* and 120*b* is −10 mT.

As indicated in FIG. 12, the output voltage is a cubic curve within the magnetic flux density range of the magnetic field acting on the first and second magnetic sensors 120*a* and 120*b*. In other words, the output characteristics of the first and second magnetic sensors 120*a* and 120*b* have a low-output region $T_1$ in which a measured voltage value lower than the virtual output voltage proportional to the magnetic flux density (input current value) is outputted. As the magnetic flux density increases from 7 mT to 10 mT, the rate of increase in the absolute value of the output voltage drops, and the error between the output voltage and the virtual output voltage increases. Meanwhile, as the input current value decreases from −7 mT to −10 mT, the rate of increase in the absolute value of the output voltage drops, and the error between the output voltage and the virtual output voltage increases.

An error rate of the output of a magnetic sensor will now be defined.

The error rate of the output of a magnetic sensor is defined as the percentage of a difference between the output voltage and the virtual output voltage relative to a full scale, which is an interval between a maximum value and a minimum value of the virtual output voltage in a magnetic flux density range corresponding to the input current measurable range of the current sensor.

For example, assuming the magnetic flux density range corresponding to an input current measurable range of ±800 A is ±10 mT, the virtual output voltage is 2.0 V when the magnetic flux density is 10 mT, and the virtual output voltage is −2.0 V when the magnetic flux density is −10 mT, the full scale is 4.0 V. In the case where the output voltage is 1.48 V and the virtual output voltage is 1.5 V when the magnetic flux density is 8 mT, the error rate of the output of the current sensor is (1.48−1.5)/4.0×100=−0.5%.

Figure 13:
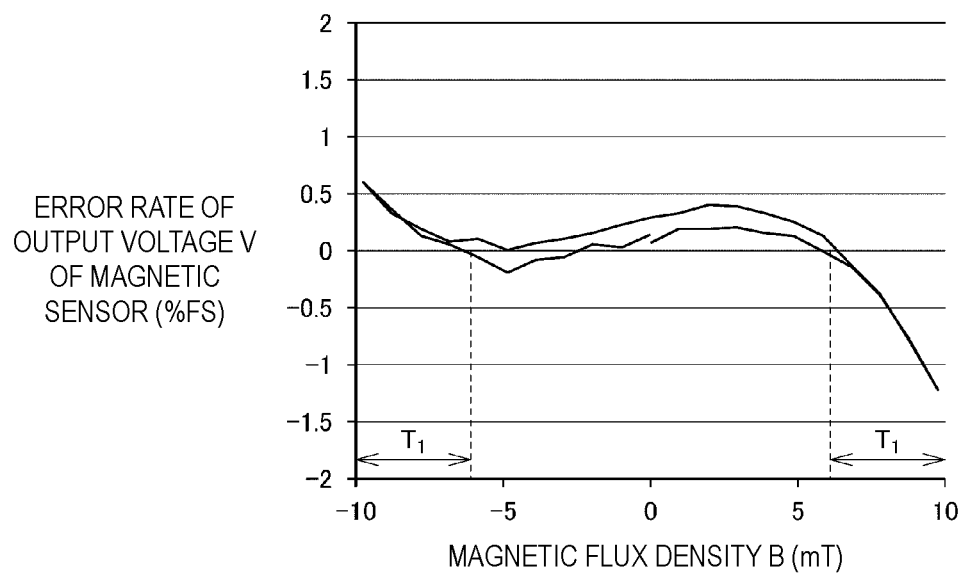
FIG. 13 is a graph illustrating a relationship between a magnetic flux density in the magnetic sensor included in the current sensor according to the first preferred embodiment of the present invention and an output error rate.

FIG. 13 is a graph illustrating a relationship between the magnetic flux density in the magnetic sensor included in the current sensor according to the present preferred embodiment and the output error rate. In FIG. 13, the vertical axis represents the output error rate (% FS), and the horizontal axis represents a magnetic flux density B (mT). As illustrated in FIG. 13, ranges in which the magnetic flux density is no greater than −7 mT and no less than 7 mT correspond to the low-output region $T_1$ for both the first and second magnetic sensors 120a and 120b.

Figure 14:
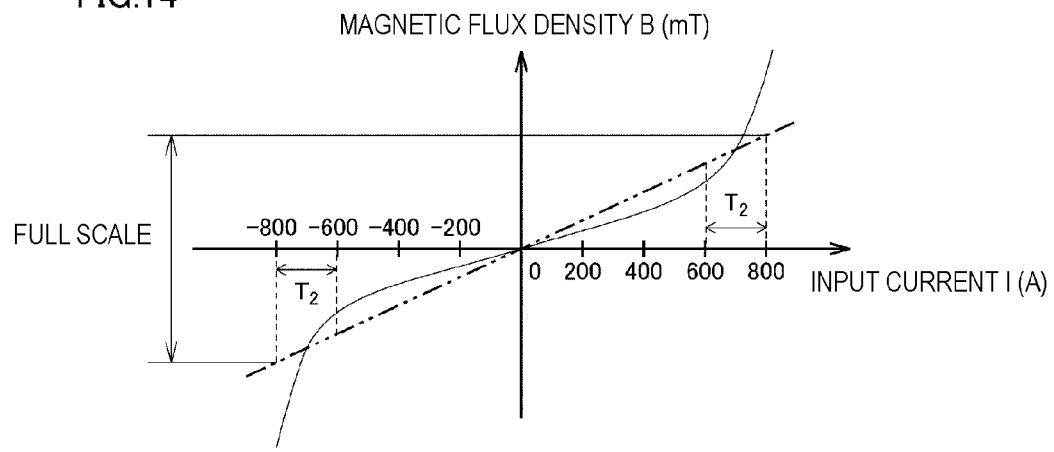
FIG. 14 is a graph illustrating magnetization characteristics of a magnetic body included in the current sensor according to the first preferred embodiment of the present invention.

FIG. 14 is a graph illustrating magnetization characteristics of the magnetic bodies included in the current sensor according to the present preferred embodiment. In FIG. 14, the vertical axis represents the magnetic flux density B (mT), and the horizontal axis represents the input current I (A). Additionally, in FIG. 14, the double-dot-dash line indicates virtual magnetic flux densities obtained through a linear approximation of the magnetic flux densities of the magnetic fields acting on the positions of the magnetic sensors, in the input current measurable range of the current sensor 100. To be more specific, the virtual magnetic flux densities are obtained by approximating input current values and magnetic flux densities with a linear function using the least-squares method. Note that FIG. 14 indicates the magnetic flux density of the magnetic field acting at the position of the magnetic sensor when only the first magnetic body 170 is disposed in the periphery of the primary conductor 110, and does not include the effects of the magnetic sensor itself and the second magnetic body 180 on the magnetic flux density.

As indicated in FIG. 14, the magnetic flux density of the magnetic field acting at the position of the magnetic sensor is a cubic curve within the input current measurable range of the current sensor 100. In other words, the magnetization characteristics of the first magnetic body 170 have a magnetic saturation region $T_2$ in which the permeability decreases in ranges where the absolute value of current flowing in the primary conductor 110 is no less than a threshold of 600 A. As the input current value increases from 600 A to 800 A, the rate of increase in the absolute value of the magnetic flux density increases. Additionally as the input current value decreases from −600 A to −800 A, the rate of increase in the absolute value of the magnetic flux density increases.

Next, the error rate of the magnetic flux density at the position of the magnetic sensor when only the magnetic body is provided in the periphery of the primary conductor 110 will be defined.

The error rate of the magnetic flux density at the position of the magnetic sensor is defined as the percentage of a difference between the magnetic flux density and the virtual magnetic flux density relative to a full scale, which is an interval between a maximum value and a minimum value of the virtual magnetic flux density in the input current measurable range of the current sensor.

For example, assuming the input current measurable range is ±800 A, the virtual magnetic flux density is 20 mT when the input current is 800 A, and the virtual magnetic flux density is −20 mT when the input current is −800 A, the full scale is 40 mT. In the case where the magnetic flux density is 20.5 mT and the virtual magnetic flux density is 19.5 mT when the input current is 750 A, the error rate of the output of the current sensor is (20.5−19.5)/40×100=2.5%.

Figure 15:
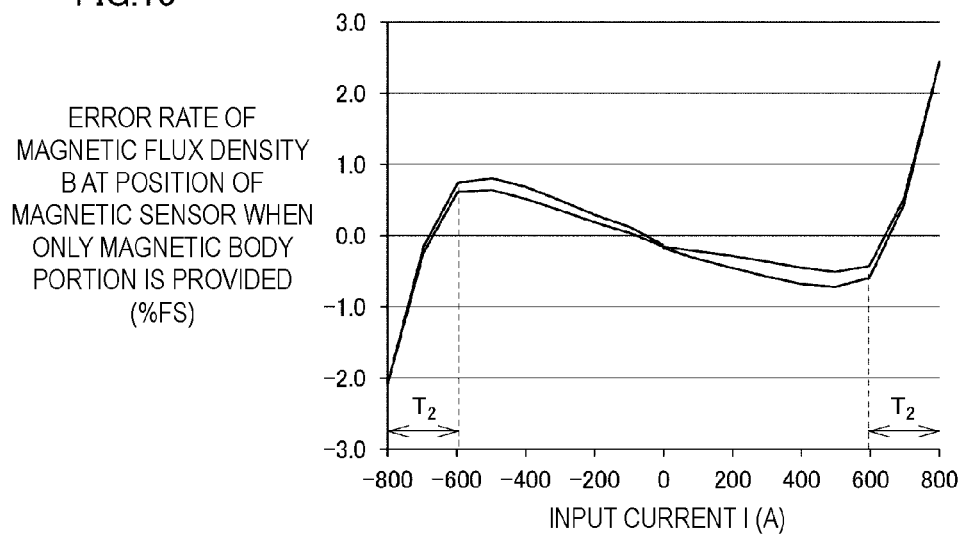
FIG. 15 is a graph illustrating a relationship between an input current and the error rate of a magnetic flux density at a position of the magnetic sensor when only a first magnetic body included in the current sensor according to the first preferred embodiment of the present invention is provided.

FIG. 15 is a graph illustrating a relationship between the input current and the error rate of the magnetic flux density at the position of the magnetic sensor when only the first magnetic body included in the current sensor according to the present preferred embodiment is provided. In FIG. 15, the vertical axis represents the error rate of the magnetic flux density (% FS), and the horizontal axis represents the input current I (A). As illustrated in FIG. 15, ranges in which the input current value is no greater than −600 A and no less than 600 A correspond to the magnetic saturation region $T_2$.

Figure 16:
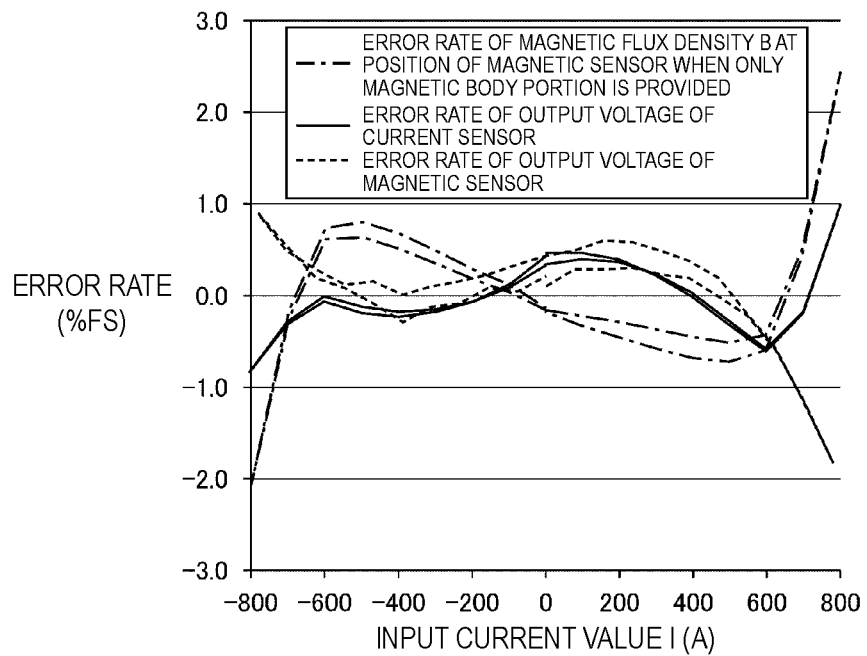
FIG. 16 is a graph illustrating an error rate of the output of the current sensor, an error rate of the output of the magnetic sensor, and an error rate of the magnetic flux density at the position of the magnetic sensor in a superimposed manner.

FIG. 16 is a graph illustrating an error rate of the output of the current sensor, an error rate of the output of the magnetic sensor, and an error rate of the magnetic flux density at the position of the magnetic sensor in a superimposed manner. In FIG. 16, the vertical axis represents the error rate of the magnetic flux density (% FS), and the horizontal axis represents the input current I (A). Additionally, in FIG. 16, the solid line indicates the error rate of the output of the current sensor, the broken line indicates the error rate of the output of the magnetic sensor, and the dot-dash line indicates the error rate of the magnetic flux density at the position of the magnetic sensor.

As illustrated in FIG. 16, with the current sensor 100 according to the present preferred embodiment, the low-output region $T_1$ of the magnetic sensor and the magnetic saturation region $T_2$ of the first magnetic body 170 overlap. As such, the error rate of the output of the current sensor 100 drops to within about ±1.0% in the input current measurable range. An error rate within about ±1.0% is considered to be within the permissible range in the present preferred embodiment, for example.

A magnetic field leaking from the first magnetic body 170 that is within the magnetic saturation region $T_2$ acts on the magnetic sensor that is in the low-output region $T_1$. This corrects the output of the magnetic sensor such that the measured voltage value increases.

Specifically, the rate of increase in the absolute value of the output voltage as the magnetic flux density increases (that is, as the input current value increases) is lower for a magnetic sensor in the low-output region $T_1$. On the other hand, the rate of increase in the absolute value of the magnetic flux density as the input current value increases is greater for the magnetic field leaking from the first magnetic body 170 in the magnetic saturation region $T_2$. Combining the magnetic sensor and the first magnetic body 170 in these states corrects the output voltage of the magnetic sensor and brings the output voltage closer to the virtual output voltage.

In the present preferred embodiment, a magnetic field leaking from a plate magnetically saturated by a magnetic field produced by current flowing in the primary conductor 110 acts on the magnetic sensors. This corrects the output voltages of the magnetic sensors so as to approach a virtual output voltage proportional to the value of the current flowing in the primary conductor 110.

Specifically, a magnetic field leaking from the first plate 171a of the first magnetic body member 171 that is magnetically saturated by a magnetic field produced by current flowing in the primary conductor 110 acts on the first magnetic sensor 120a. This corrects the output voltage of the first magnetic sensor 120a so as to approach a virtual output voltage proportional to the value of the current flowing in the primary conductor 110.

Likewise, a magnetic field leaking from the first plate 172*a* of the first magnetic body member 172 that is magnetically saturated by a magnetic field produced by current flowing in the primary conductor 110 acts on the second magnetic sensor 120*b*. This corrects the output voltage of the second magnetic sensor 120*b* so as to approach a virtual output voltage proportional to the value of the current flowing in the primary conductor 110.

Correcting the output voltages of the magnetic sensors to approach the virtual output voltages within the input current measurable range of the current sensor 100 as described above makes it possible to broaden the input current measurable range while reducing the error rate of the output of the current sensor 100. For example, the input current measurable range can be broadened to ±800 A while reducing the error rate of the output of the current sensor 100 to within about ±1.0%, for example.

The magnetization characteristics of the magnetic bodies are set as appropriate in accordance with the output characteristics of the magnetic sensors so as to realize a favorable combination of magnetic sensor output characteristics and magnetic body magnetization characteristics. The saturation magnetic flux density and permeability of the material constituting the magnetic body, and the shape of the magnetic body, are factors that determine the magnetization characteristics of the magnetic body. The thickness, width, and length of the magnetic body members, as well as the size and position of the gaps, are factors in the shape of the magnetic body.

Providing the gaps 173 in the first magnetic body 170 increases the magnetoresistance with respect to the magnetic flux circling in the first magnetic body 170 as a result of the magnetic field produced by current flowing in the primary conductor 110. It is thus possible to increase the absolute value of the input current when the first magnetic body members 171 and 172 are magnetically saturated due to the magnetic field produced by current flowing in the primary conductor 110, as compared to a case where the gaps 173 are not provided.

Setting these factors appropriately makes it possible to adjust the range in which the low-output region $T_1$ of the magnetic sensor and the magnetic saturation region $T_2$ of the first magnetic body 170 overlap, and favorably correct the output of the current sensor 100. A current sensor 100 having a broad measurement range while maintaining good sensitivity is able to be achieved as a result.

The processing circuit included in the current sensor 100 according to the present preferred embodiment will be described next. As illustrated in FIG. 9, the X-axis direction magnetic flux acting on the first magnetic sensor 120*a* and the X-axis direction magnetic flux acting on the second magnetic sensor 120*b* have opposite orientations. Accordingly, the detection value of the first magnetic sensor 120*a* and the detection value of the second magnetic sensor 120*b* have opposite phases with respect to the strength of the magnetic field produced by the current flowing in the primary conductor 110.

As such, when the strength of the magnetic field detected by the first magnetic sensor 120*a* is a positive value, the strength of the magnetic field detected by the second magnetic sensor 120*b* is a negative value. The detection value of the first magnetic sensor 120*a* and the detection value of the second magnetic sensor 120*b* are sent to the calculator 190.

The calculator 190 subtracts the detection value of the second magnetic sensor 120*b* from the detection value of the first magnetic sensor 120*a*. The absolute value of the detection value of the first magnetic sensor 120*a* and the absolute value of the detection value of the second magnetic sensor 120*b* are added together as a result. The value of the current flowing in the primary conductor 110 is calculated from this addition result.

In the current sensor 100 according to the present preferred embodiment, the primary conductor 110, the first printed board 130*a*, and the second printed board 130*b* are positioned between the first magnetic sensor 120*a* and the second magnetic sensor 120*b*, and thus it is physically impossible for external magnetic field sources to be positioned between the first magnetic sensor 120*a* and the second magnetic sensor 120*b*.

As such, the orientation of a magnetic field component, of the magnetic field acting on the first magnetic sensor 120*a* from an external magnetic field source, that is in the direction of the detection axis, is the same as the orientation of a magnetic field component, of the magnetic field acting on the second magnetic sensor 120*b* from the external magnetic field source, that is in the direction of the detection axis. Accordingly, when the strength of the external magnetic field detected by the first magnetic sensor 120*a* is a positive value, the strength of the external magnetic field detected by the second magnetic sensor 120*b* is also a positive value.

Thus, when the calculator 190 subtracts the detection value of the second magnetic sensor 120*b* from the detection value of the first magnetic sensor 120*a*, a difference between the absolute value of the detection value of the first magnetic sensor 120*a* and the absolute value of the detection value of the second magnetic sensor 120*b* is determined. The magnetic field from the external magnetic field source is thus almost entirely undetected. In other words, the effects of the external magnetic field are reduced.

As a variation on the present preferred embodiment, the first magnetic sensor 120*a* and the second magnetic sensor 120*b* may be set such that the directions of the detection axes in which the detection values are positive are opposite from each other (for example, inverted by 180°). In this case, when the strength of the external magnetic field detected by the first magnetic sensor 120*a* is a positive value, the strength of the external magnetic field detected by the second magnetic sensor 120*b* is a negative value.

However, the detection value of the first magnetic sensor 120*a* and the detection value of the second magnetic sensor 120*b* have the same phase, with respect to the strength of the magnetic field produced by current flowing in the primary conductor 110.

In this variation, an adder or a summing amplifier is used as the calculator 190 instead of a differential amplifier. With respect to the strength of the external magnetic field, using an adder or a summing amplifier to add the detection value of the first magnetic sensor 120*a* and the detection value of the second magnetic sensor 120*b* results in a difference between the absolute value of the detection value of the first magnetic sensor 120*a* and the absolute value of the detection value of the second magnetic sensor 120*b* being determined. The magnetic field from the external magnetic field source is thus almost entirely undetected. In other words, the effects of the external magnetic field are reduced.

On the other hand, with respect to the strength of the magnetic field produced by current flowing in the primary conductor 110, using an adder or a summing amplifier to add the detection value of the first magnetic sensor 120*a* and the detection value of the second magnetic sensor 120*b* results in the absolute value of the detection value of the first magnetic sensor 120*a* and the absolute value of the detection value of the second magnetic sensor 120*b* being added. The value of the current flowing in the primary conductor 110 is calculated from this addition result.

In this manner, an adder or a summing amplifier may be used as the calculator instead of a differential amplifier, while setting the input/output characteristics of the first magnetic sensor 120a and the second magnetic sensor 120b to opposite polarities.

Figure 17:
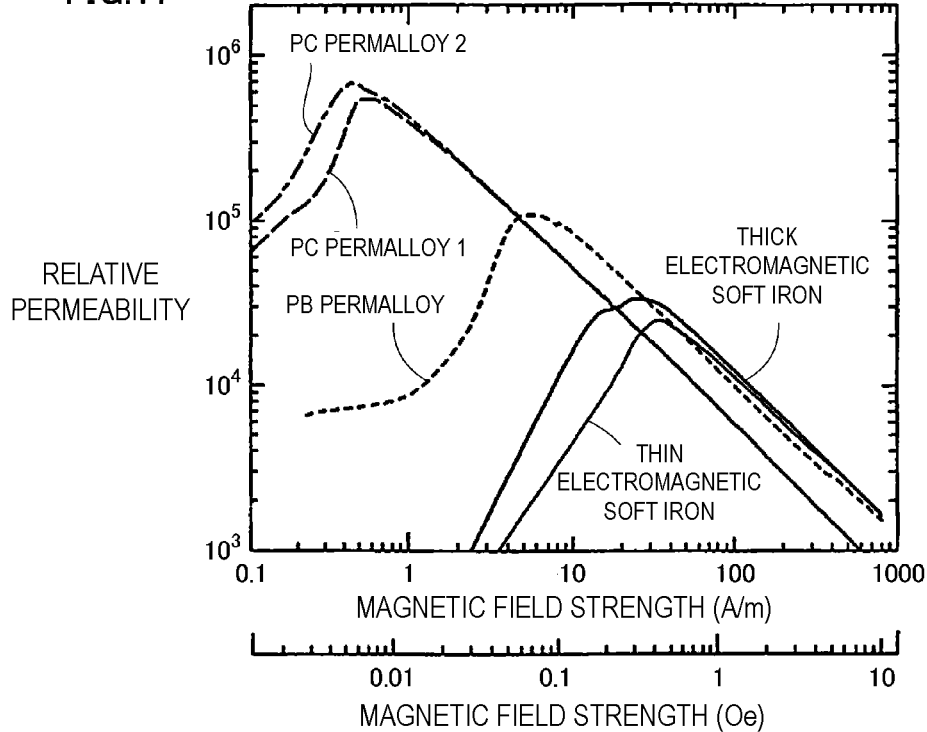
FIG. 17 is a graph illustrating a relationship between the relative permeability of a magnetic material and the strength of a magnetic field.

As described above, in the current sensor 100 according to the present preferred embodiment, the first magnetic body members 171 and 172 are made of PC permalloy, and the second magnetic body member is made of PC permalloy. FIG. 17 is a graph illustrating a relationship between the relative permeability of a magnetic material and the strength of a magnetic field. In FIG. 17, the vertical axis represents the relative permeability of the magnetic material, and the horizontal axis represents the strength of the magnetic field. The magnetic shielding effect of a magnetic material is greater the higher the permeability of the magnetic material is. As illustrated in FIG. 17, when the magnetic field strength is approximately 1.0 (Oe), the relative permeability of PC permalloy is approximately the same as that of soft steel and electromagnetic steel. Thus, using the calculator 190 described above to ensure that a magnetic field from an external magnetic field source is almost undetected makes it possible to reduce the influence of the external magnetic field, regardless of the strength of the external magnetic field.

As illustrated in FIGS. 1 and 3, in the current sensor 100 according to the present preferred embodiment, the first magnetic sensor 120a and the second magnetic sensor 120b are doubly enclosed by the first magnetic body 170 and the second magnetic body 180. This makes it possible to reliably prevent a situation in which an external magnetic field, which is a cause of error, reaches the first magnetic sensor 120a and the second magnetic sensor 120b. This in turn makes it possible to ensure that the first magnetic sensor 120a and the second magnetic sensor 120b do not needlessly detect external magnetic fields. In other words, the first magnetic body 170 and the second magnetic body 180 define and function as magnetic shields.

In the current sensor 100 according to the present preferred embodiment, the second magnetic body 180 preferably is shaped as a tube that is continuous throughout the entire circumference thereof, and thus the second magnetic body 180 has no gaps in the circumferential direction thereof that act as paths through which external magnetic fields can enter. Thus, a situation in which an external magnetic field, which is a cause of error, reaches the first magnetic sensor 120a and the second magnetic sensor 120b is able to be more reliably reduced or prevented.

Additionally, in the current sensor 100 according to the present preferred embodiment, the first magnetic sensor 120a and the second magnetic sensor 120b are each positioned in a robust region. It thus is not necessary to assemble the current sensor 100 with a high level of precision, which enables the current sensor 100 to be manufactured with ease.

Hereinafter, a current sensor according to a second preferred embodiment of the present invention will be described. Note that a current sensor 200 according to the second preferred embodiment differs from the current sensor according to the first preferred embodiment only in that gaps are provided in the second magnetic body, and thus descriptions of other elements and features of the configuration will not be repeated.

Second Preferred Embodiment

Figure 18:
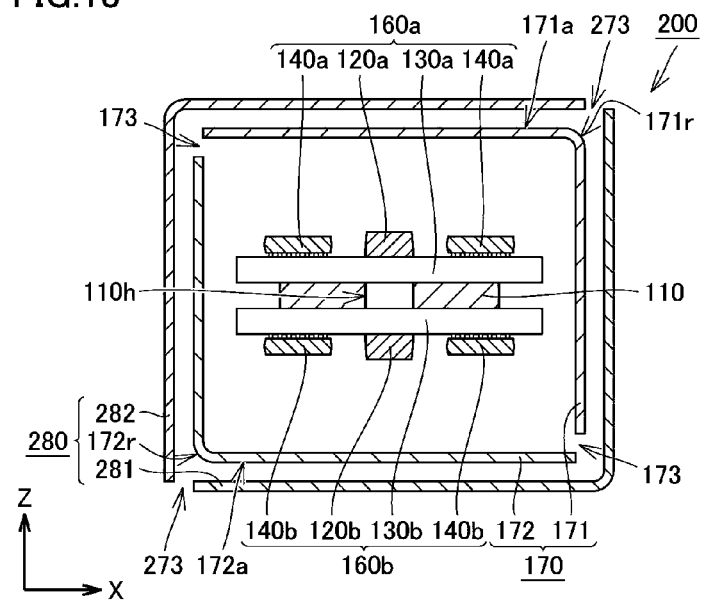
FIG. 18 is a cross-sectional view illustrating the configuration of a current sensor according to a second preferred embodiment of the present invention.

FIG. 18 is a cross-sectional view illustrating the configuration of the current sensor according to the second preferred embodiment of the present invention. FIG. 18 illustrates the cross-section of the current sensor from the same direction as that used in FIG. 3.

As illustrated in FIG. 18, in the current sensor 200 according to the second preferred embodiment of the present invention, gaps 273 are provided in a second magnetic body 280, and due to the gaps 273, the second magnetic body 280 is shaped as a tube that is non-continuous in the circumferential direction. In the present preferred embodiment, the second magnetic body 280 includes two second magnetic body members 281 and 282. Viewed from the direction in which current flows in the primary conductor 110 (the Y-axis direction), the two second magnetic body members 281 and 282 preferably are rectangular or substantially rectangular, with the gaps 273 provided between end portions of the members, and surround the periphery of the two first magnetic body members 171 and 172 while being distanced therefrom.

As illustrated in FIG. 18, viewed from the direction in which current flows in the primary conductor 110 (the Y-axis direction), the two second magnetic body members 281 and 282 preferably have L shapes, for example. The gaps 273 in the second magnetic body 280 are located on outer side portions of corner portions 171r and 172r of the first magnetic body members 171 and 172, respectively.

The second magnetic body members 281 and 282 each include a third plate, and a fourth plate that is perpendicular or substantially perpendicular to the corresponding third plate. The third plates of the second magnetic body members 281 and 282, respectively, are parallel or substantially parallel to the primary conductor 110. The third plate of the second magnetic body member 281 and the first plate of the first magnetic body member 172 are parallel or substantially parallel to each other with a gap therebetween. The third plate of the second magnetic body member 282 and the first plate of the first magnetic body member 171 are parallel or substantially parallel to each other with a gap therebetween.

The fourth plate of the second magnetic body member 281 and the second plate of the first magnetic body member 171 are parallel or substantially parallel to each other with a gap therebetween. The fourth plate of the second magnetic body member 282 and the second plate of the first magnetic body member 172 are parallel or substantially parallel to each other with a gap therebetween.

Each of the two gaps 273 extends from one end portion to another end portion of the second magnetic body 280 in the direction in which current flows in the primary conductor 110 (the Y-axis direction). Viewed from the direction in which current flows in the primary conductor 110 (the Y-axis direction), the two gaps 273 are located at opposite corners of the rectangle defined by the second magnetic body members 281 and 282. Viewed from the direction in which current flows in the primary conductor 110 (the Y-axis direction), the position of the center of the rectangle defined by the second magnetic body members 281 and 282 overlaps with the position of the through-hole 110h in the primary conductor 110.

The second magnetic body members 281 and 282 are both made of PC permalloy, but the materials of the second magnetic body members 281 and 282 are not limited to PC permalloy. A magnetic material exhibiting high permeability and saturation magnetic flux density is preferable, such as soft steel, silicon steel, electromagnetic steel, PB permalloy, nickel alloy, iron alloy, or ferrite.

In the present preferred embodiment, the second magnetic body members 281 and 282 are each formed preferably by press-machining a thin plate. However, the method of forming the second magnetic body members 281 and 282 is not limited thereto, and the second magnetic body members 281 and 282 may be formed using a method such as cutting, forging, or casting.

As illustrated in FIG. 18, in the current sensor 200 according to the present preferred embodiment, the first magnetic sensor 120a and the second magnetic sensor 120b are doubly enclosed by the first magnetic body 170 and the second magnetic body 280. This makes it possible to prevent a situation in which an external magnetic field, which is a cause of error, reaches the first magnetic sensor 120a and the second magnetic sensor 120b. This in turn makes it possible to ensure that the first magnetic sensor 120a and the second magnetic sensor 120b do not needlessly detect external magnetic fields. In other words, the first magnetic body 170 and the second magnetic body 280 define and function as magnetic shields.

Additionally, the gaps 273 in the second magnetic body 280 are located on outer side portions of the corner portions 171r and 172r of the first magnetic body members 171 and 172, respectively. As such, the peripheries of the first magnetic sensor 120a and the second magnetic sensor 120b are able to be completely or substantially completely enclosed by the first magnetic body 170 and the second magnetic body 280. Thus, a situation in which an external magnetic field, which is a cause of error, reaches the first magnetic sensor 120a and the second magnetic sensor 120b is able to be reliably reduced or prevented.

In the current sensor 200 according to the present preferred embodiment, providing the gaps 273 in the second magnetic body 280 increases the magnetoresistance with respect to the magnetic flux circling in the second magnetic body 280 as a result of the magnetic field produced by current flowing in the primary conductor 110 or an external magnetic field. As a result, a situation in which the second magnetic body members 281 and 282 are magnetically saturated due to the magnetic field produced by current flowing in the primary conductor 110 or the external magnetic field is prevented. This makes it possible to ensure the second magnetic body 280 defines and functions as a magnetic shield, which in turn makes it possible to prevent a situation in which an external magnetic field reaches the first magnetic sensor 120a and the second magnetic sensor 120b.

The current sensor 200 according to the present preferred embodiment is also able to broaden the input current measurable range while reducing an error rate of the output of the current sensor 200. In other words, a current sensor 200 having a broad measurement range while maintaining good sensitivity is able to be achieved.

Hereinafter, a current sensor according to a third preferred embodiment of the present invention will be described. Note that a current sensor 300 according to the third preferred embodiment differs from the current sensor according to the second preferred embodiment only in that two magnetic sensors are mounted on a single printed board, and thus descriptions of other elements and features of the configuration will not be repeated.

Third Preferred Embodiment

Figure 19:
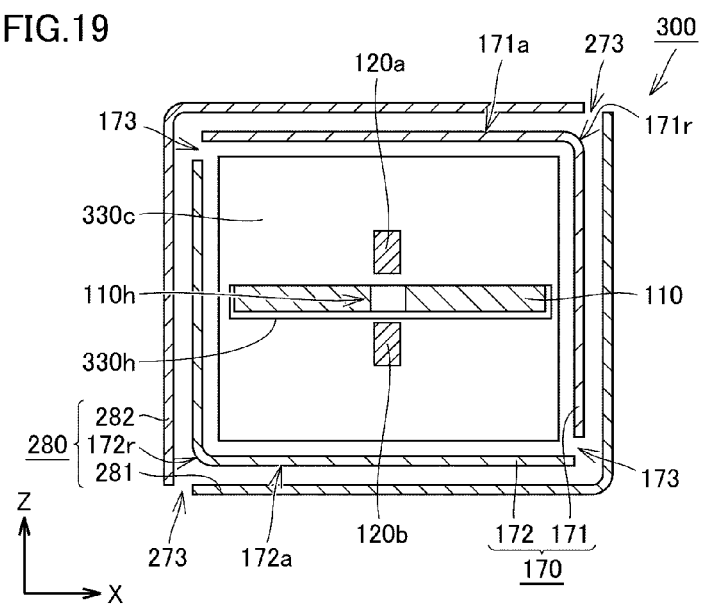
FIG. 19 is a cross-sectional view illustrating the configuration of a current sensor according to a third preferred embodiment of the present invention.

FIG. 19 is a cross-sectional view illustrating the configuration of the current sensor according to the third preferred embodiment of the present invention. FIG. 19 illustrates the cross-section of the current sensor from the same direction as that used in FIG. 3. As illustrated in FIG. 19, in the current sensor 300 according to the third preferred embodiment of the present invention, a printed board 330c is held in a state in which the primary conductor 110 is inserted into a through-hole 330h. In other words, the printed board 330c is positioned perpendicular to the primary conductor 110.

The first magnetic sensor 120a and the second magnetic sensor 120b are mounted on the printed board 330c along with a differential amplifier and a passive element. Note, however, that FIG. 19 does not illustrate the differential amplifier and the passive element. The differential amplifier and the passive element may be mounted on a different printed board from the printed board 330c on which the first magnetic sensor 120a and the second magnetic sensor 120b are mounted.

The first magnetic sensor 120a and the second magnetic sensor 120b are positioned on opposite sides from each other with the through-hole 330h located therebetween. The first magnetic sensor 120a and the second magnetic sensor 120b are each located apart from the through-hole 330h. In a state where the primary conductor 110 is inserted into the through-hole 330h of the printed board 330c, the first magnetic sensor 120a is positioned directly above the through-hole 330h and the second magnetic sensor 120b is positioned directly below the through-hole 330h. In other words, the first magnetic sensor 120a and the second magnetic sensor 120b are positioned on opposite sides from each other with the primary conductor 110 interposed therebetween.

With the current sensor 300 according to the present preferred embodiment, both the first magnetic sensor 120a and the second magnetic sensor 120b are located within a robust region. In other words, the gaps between the through-hole 330h and the first and second magnetic sensors 120a and 120b are appropriately set such that the first magnetic sensor 120a and the second magnetic sensor 120b are located within the robust region.

The direction of the detection axes of the first magnetic sensor 120a and the second magnetic sensor 120b (the magnetism sensing direction) corresponds to the width direction of the primary conductor 110 (the X-axis direction). With the current sensor 300 according to the present preferred embodiment too, the densities of magnetic fluxes in the X-axis direction, the Y-axis direction, and the Z-axis direction, acting on the first magnetic sensor 120a and the second magnetic sensor 120b, are able to be significantly reduced. This makes it possible to prevent a situation in which variation arises in the strengths of the magnetic fields acting on the first magnetic sensor 120a and the second magnetic sensor 120b. The current sensor 300 is therefore able to more reliably and accurately measure the magnitude of a current to be measured.

The current sensor 300 according to the present preferred embodiment is also able to broaden the input current measurable range while reducing an error rate of the output of the current sensor 300. In other words, a current sensor 300 having a broad measurement range while maintaining good sensitivity is able to be achieved.

Hereinafter, a current sensor according to a fourth preferred embodiment of the present invention will be described. Note that a current sensor 400 according to the fourth preferred embodiment differs from the current sensor according to the third preferred embodiment only in that a printed board and a magnetic body member are able to be attached to and detached from the primary conductor, and thus descriptions of other elements and features of the configuration will not be repeated.

Fourth Preferred Embodiment

Figure 20:
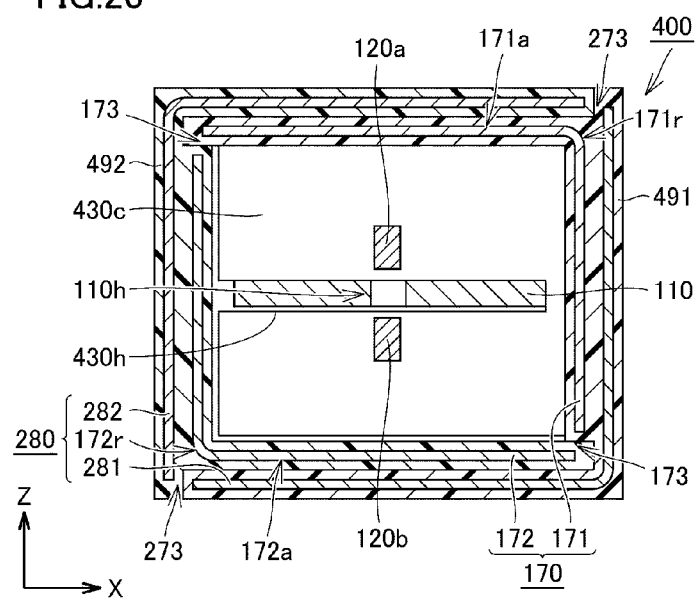
FIG. 20 is a cross-sectional view illustrating a state in which a printed board and a magnetic body member have been attached to a primary conductor, in a current sensor according to a fourth preferred embodiment of the present invention.
Figure 21:
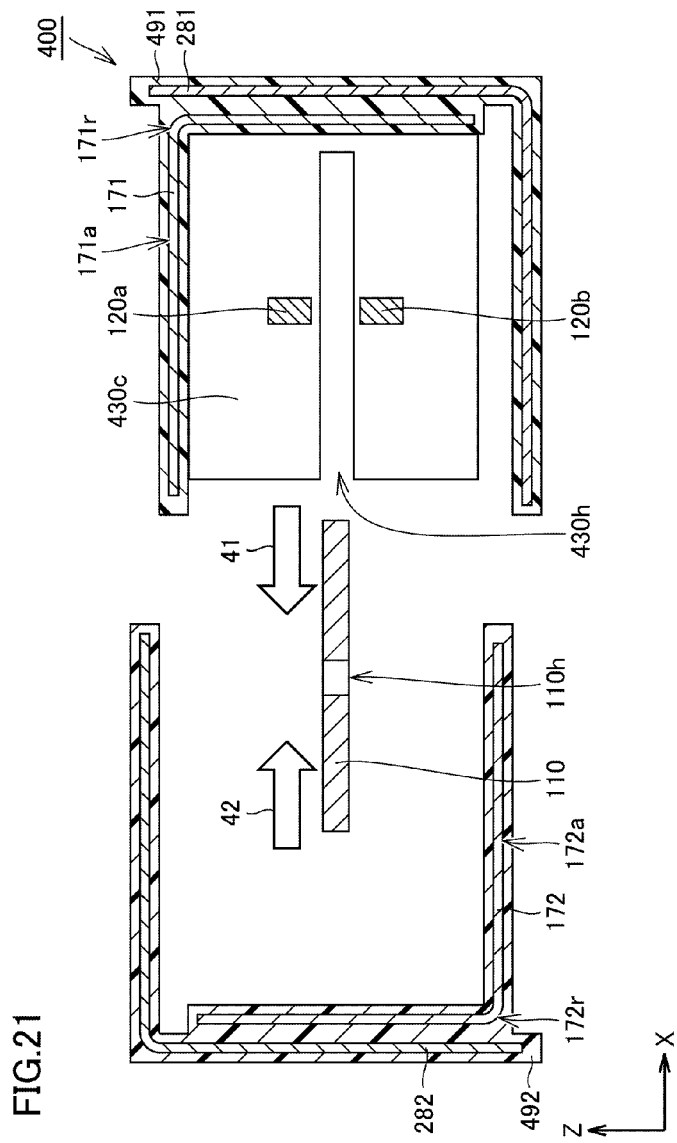
FIG. 21 is a cross-sectional view illustrating a state prior to the printed board and the magnetic body member being attached to the primary conductor, in the current sensor according to the fourth preferred embodiment of the present invention.

FIG. 20 is a cross-sectional view illustrating a state in which a printed board and a magnetic body member have been attached to a primary conductor, in the current sensor according to the fourth preferred embodiment of the present invention. FIG. 21 is a cross-sectional view illustrating a state prior to the printed board and the magnetic body member being attached to the primary conductor, in the current sensor according to the fourth preferred embodiment of the present invention. FIGS. 20 and 21 illustrate the cross-section of the current sensor from the same direction as that used in FIG. 3.

As illustrated in FIGS. 20 and 21, in the current sensor 400 according to the fourth preferred embodiment of the present invention, the first magnetic body member 171, the second magnetic body member 281, and a printed board 430c are bonded together preferably using a first bonding material 491, made of a resin, an adhesive, or the like, to provide an integral entity. The first magnetic body member 172 and the second magnetic body member 282 are bonded together preferably using a second bonding material 492, made of a resin, an adhesive, or the like, to provide an integral entity.

Specifically, the peripheral surface of the printed board 430c and the inner surface of the first magnetic body member 171 are bonded to each other by the first bonding material 491. The outer surface of the second plate of the first magnetic body member 171 and the inner surface of the fourth plate of the second magnetic body member 281, which oppose each other, are bonded together by the first bonding material 491. The outer surface of the second plate of the first magnetic body member 172 and the inner surface of the fourth plate of the second magnetic body member 282, which oppose each other, are bonded together by the second bonding material 492. In the case where the first bonding material 491 and the second bonding material 492 are both made of a resin, the above-described members are bonded to each other through thermal welding.

A penetrating groove 430h is provided in the printed board 430c, penetrating from an end surface of the peripheral surface thereof on the side not enclosed by the first magnetic body member 171 and the second magnetic body member 281, toward an end surface on the side opposite therefrom. A gap into which the first plate of the first magnetic body member 172 can be inserted is provided between the printed board 430c and the third plate of the second magnetic body member 281.

When the printed board 430c, the first magnetic body members 171 and 172, and the second magnetic body members 281 and 282 are attached to the primary conductor 110, the printed board 430c, the first magnetic body member 171, and the second magnetic body member 281 are brought toward the primary conductor 110 in the direction indicated by the arrow 41 such that the primary conductor 110 is inserted into the penetrating groove 430h in the printed board 430c. Meanwhile, the first magnetic body member 172 and the second magnetic body member 282 are brought toward the primary conductor 110 in the direction indicated by the arrow 42 such that the first plate of the first magnetic body member 172 is inserted into the gap between the printed board 430c and the third plate of the second magnetic body member 281.

As illustrated in FIG. 20, in a state where the printed board 430c and the magnetic body members are attached to the primary conductor 110, the printed board 430c is held in a state in which the primary conductor 110 is inserted into the penetrating groove 430h. In other words, the printed board 430c is positioned perpendicular or substantially perpendicular to the primary conductor 110.

In the present preferred embodiment, the two gaps 173 and the two gaps 273 are each embedded in at least one of the first bonding material 491 and the second bonding material 492. The current sensor 400 according to the present preferred embodiment is structured such that the printed board 430c and the magnetic body members attached to and detached from the primary conductor 110, and thus the current sensor 400 is able to be assembled and disassembled with ease.

Additionally, the gaps 273 in the second magnetic body 280 are located on outer side portions of the corner portions 171r and 172r of the first magnetic body members 171 and 172, respectively. As such, the periphery of the first magnetic sensor 120a and the second magnetic sensor 120b are able to be completely or substantially completely enclosed by the first magnetic body 170 and the second magnetic body 280. Thus, a situation in which an external magnetic field, which is a cause of error, reaches the first magnetic sensor 120a and the second magnetic sensor 120b is able to be reliably prevented.

The current sensor 400 according to the present preferred embodiment also is able to broaden the input current measurable range while reducing an error rate of the output of the current sensor 400. In other words, a current sensor 400 having a broad measurement range while maintaining good sensitivity is able to be achieved.

Hereinafter, a current sensor according to a fifth preferred embodiment of the present invention will be described. Note that a current sensor 500 according to the fifth preferred embodiment differs from the current sensor according to the first preferred embodiment mainly in terms of the configuration of the first magnetic body and that only a single magnetic sensor is provided, and thus descriptions of other elements and features of the configuration will not be repeated.

Fifth Preferred Embodiment

FIG. 22 is a cross-sectional view illustrating the configuration of the current sensor according to the fifth preferred embodiment of the present invention. FIG. 22 illustrates the cross-section of the current sensor from the same direction as that used in FIG. 3. Additionally, FIG. 22 only illustrates the first magnetic sensor 120a of the circuit board.

As illustrated in FIG. 22, the current sensor 500 according to the fifth preferred embodiment of the present invention includes only a single first magnetic sensor 120a as a magnetic sensor. The first magnetic sensor 120a is positioned directly above the primary conductor 110. Note that a penetrating portion is not provided in the primary conductor 110 in the present preferred embodiment.

Additionally, the current sensor 500 includes only a single plate-shaped first magnetic body member as a first magnetic body 570. The first magnetic body 570 is positioned between the primary conductor 110 and the first magnetic sensor 120a at a distance from each. The first magnetic body 570 is parallel or substantially parallel to the primary conductor 110.

In the current sensor 500 according to the present preferred embodiment too, a magnetic field leaking from the first magnetic body 570 that is within the magnetic saturation region $T_2$ acts on the first magnetic sensor 120a that is in the low-output region $T_1$. This makes it possible to correct the output of the first magnetic sensor 120a such that the measured voltage value increases.

Accordingly, the input current measurable range is able to be broadened while reducing the error rate of the output of the current sensor 500. In other words, a current sensor 500 having a broad measurement range while maintaining good sensitivity is able to be achieved.

Note that the position of the first magnetic body 570 is not limited to that described above. A first variation on the current sensor 500 according to the present preferred embodiment will be described next.

FIG. 23 is a cross-sectional view illustrating the configuration of a current sensor according to the first variation on the fifth preferred embodiment of the present invention. FIG. 23 illustrates the cross-section of the current sensor from the same direction as that used in FIG. 3.

As illustrated in FIG. 23, in a current sensor 500a according to the first variation on the fifth preferred embodiment of the present invention, the first magnetic body 570 is positioned between the first magnetic sensor 120a and the second magnetic body 180 at a distance from each.

In the current sensor 500a according to the present variation too, a magnetic field leaking from the first magnetic body 570 that is within the magnetic saturation region $T_2$ acts on the first magnetic sensor 120a that is in the low-output region $T_1$. This makes it possible to correct the output of the first magnetic sensor 120a such that the measured voltage value increases.

Furthermore, the first magnetic body 570 may include two plate-shaped first magnetic body members. A second variation on the current sensor 500 according to the present preferred embodiment will be described next.

Figure 24:
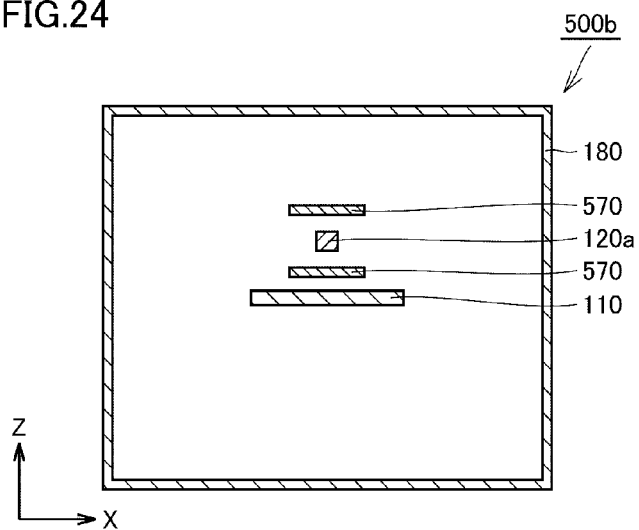
FIG. 24 is a cross-sectional view illustrating the configuration of a current sensor according to a second variation on the fifth preferred embodiment of the present invention.

FIG. 24 is a cross-sectional view illustrating the configuration of a current sensor according to the second variation on the fifth preferred embodiment of the present invention. FIG. 24 illustrates the cross-section of the current sensor from the same direction as that used in FIG. 3.

As illustrated in FIG. 24, in a current sensor 500b according to the second variation on the fifth preferred embodiment of the present invention, the first magnetic body 570 includes two plate-shaped first magnetic body members.

One of the two first magnetic body members is positioned between the primary conductor 110 and the first magnetic sensor 120a at a distance from each. The other of the two first magnetic body members is positioned between the first magnetic sensor 120a and the second magnetic body 180 at a distance from each. In other words, the first magnetic sensor 120a is positioned between the two first magnetic body members.

In the current sensor 500b according to the present variation too, a magnetic field leaking from the first magnetic body 570 that is within the magnetic saturation region $T_2$ acts on the first magnetic sensor 120a that is in the low-output region $T_1$. This makes it possible to correct the output of the first magnetic sensor 120a such that the measured voltage value increases.

Additionally, the first magnetic body member and the primary conductor 110 may be perpendicular or substantially perpendicular to each other. A third variation on the current sensor 500 according to the present preferred embodiment will be described next.

Figure 25:
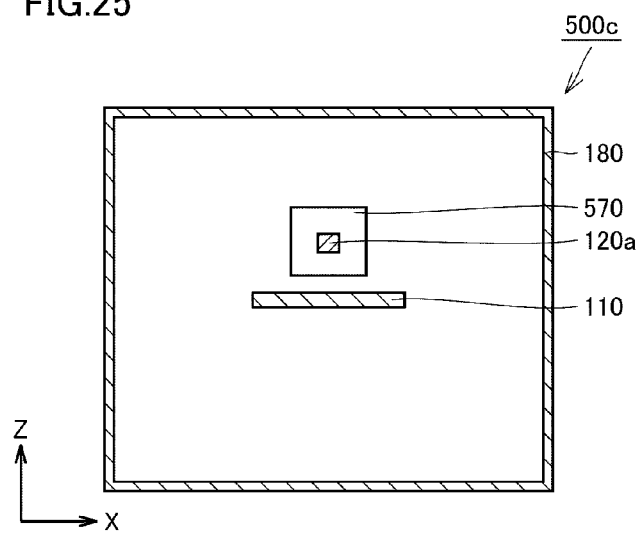
FIG. 25 is a cross-sectional view illustrating the configuration of a current sensor according to a third variation on the fifth preferred embodiment of the present invention.

FIG. 25 is a cross-sectional view illustrating the configuration of a current sensor according to the third variation on the fifth preferred embodiment of the present invention. FIG. 25 illustrates the cross-section of the current sensor from the same direction as that used in FIG. 3.

As illustrated in FIG. 25, in a current sensor 500c according to the third variation on the fifth preferred embodiment of the present invention, the first magnetic body 570 is positioned between the primary conductor 110 and the second magnetic body 180 at a distance from each.

The first magnetic body 570 includes a single plate-shaped first magnetic body member. The first magnetic body 570 is perpendicular or substantially perpendicular to the primary conductor 110. The first magnetic body 570 extends along the direction of the detection axis of the first magnetic sensor 120a (that is, along the magnetism sensing direction), and opposes the first magnetic sensor 120a at a distance from the first magnetic sensor 120a.

In the current sensor 500c according to the present variation too, a magnetic field leaking from the first magnetic body 570 that is within the magnetic saturation region $T_2$ acts on the first magnetic sensor 120a that is in the low-output region $T_1$. This makes it possible to correct the output of the first magnetic sensor 120a such that the measured voltage value increases.

Furthermore, the primary conductor 110 may extend through the first magnetic body. A fourth variation on the current sensor 500 according to the present preferred embodiment will be described next.

Figure 26:
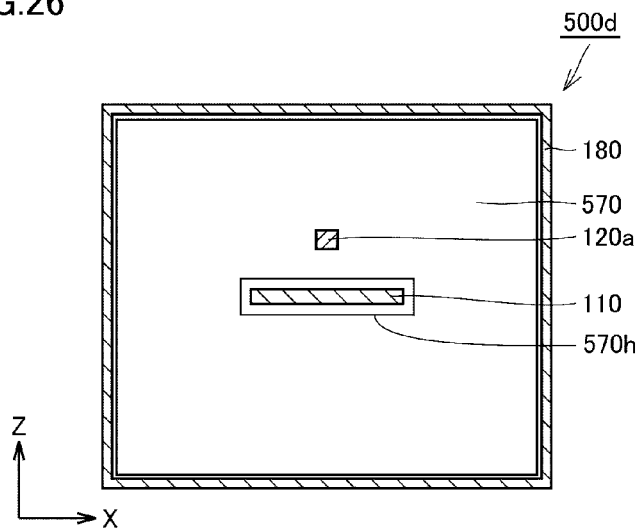
FIG. 26 is a cross-sectional view illustrating the configuration of a current sensor according to a fourth variation on the fifth preferred embodiment of the present invention.

FIG. 26 is a cross-sectional view illustrating the configuration of a current sensor according to the fourth variation on the fifth preferred embodiment of the present invention. FIG. 26 illustrates the cross-section of the current sensor from the same direction as that used in FIG. 3.

As illustrated in FIG. 26, in a current sensor 500d according to the fourth variation on the fifth preferred embodiment of the present invention, a through-hole 570h is provided in the first magnetic body member of the first magnetic body 570. The primary conductor 110 is inserted into the through-hole 570h in the first magnetic body member. The first magnetic body member and the primary conductor 110 are not in contact with each other. An outer edge of the first magnetic body member opposes an inner edge of the second magnetic body member with a slight gap provided therebetween. The first magnetic body 570 extends along the direction of the detection axis of the first magnetic sensor 120a (that is, along the magnetism sensing direction), and opposes the first magnetic sensor 120a at a distance from the first magnetic sensor 120a.

In the current sensor 500d according to the present variation too, a magnetic field leaking from the first magnetic body 570 that is within the magnetic saturation region $T_2$ acts on the first magnetic sensor 120a that is in the low-output region $T_1$. This makes it possible to correct the output of the first magnetic sensor 120a such that the measured voltage value increases.

Additionally, the first magnetic body 570 and a second magnetic body 580 surround the periphery of the first magnetic sensor 120a, which makes it possible to prevent a situation in which an external magnetic field, which is a cause of error, reaches the first magnetic sensor 120a.

Hereinafter, a current sensor according to a sixth preferred embodiment of the present invention will be described. Note that a current sensor 600 according to the sixth preferred embodiment differs from the current sensor according to the first preferred embodiment mainly in that the second magnetic body is not provided and only a single magnetic sensor is provided, and thus descriptions of other elements and features of the configuration will not be repeated.

Sixth Preferred Embodiment

Figure 27:
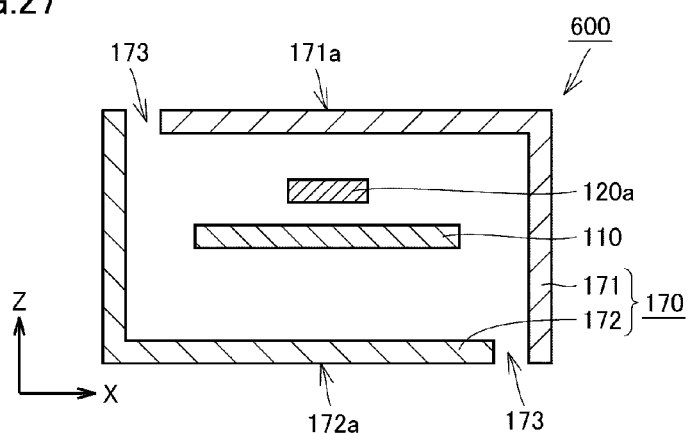
FIG. 27 is a cross-sectional view illustrating the configuration of a current sensor according to a sixth preferred embodiment of the present invention.

FIG. 27 is a cross-sectional view illustrating the configuration of the current sensor according to the sixth preferred embodiment of the present invention. FIG. 27 illustrates the cross-section of the current sensor from the same direction as that used in FIG. 3. Additionally, FIG. 27 only illustrates the first magnetic sensor 120a of the circuit board.

As illustrated in FIG. 27, the current sensor 600 according to the sixth preferred embodiment of the present invention includes only a single first magnetic sensor 120a as a magnetic sensor. The first magnetic sensor 120a is positioned directly above the primary conductor 110. Note that a penetrating portion is not provided in the primary conductor 110 in the present preferred embodiment. The current sensor 600 does not include a second magnetic body.

In the current sensor 600 according to the present preferred embodiment too, a magnetic field leaking from the first magnetic body 170 that is within the magnetic saturation region $T_2$ acts on the first magnetic sensor 120a that is in the low-output region $T_1$. This makes it possible to correct the output of the first magnetic sensor 120a such that the measured voltage value increases.

Specifically, a magnetic field leaking from the first plate 171a of the first magnetic body member 171 that is magnetically saturated by a magnetic field produced by current flowing in the primary conductor 110 acts on the first magnetic sensor 120a. This corrects the output voltage of the first magnetic sensor 120a so as to approach a virtual output voltage proportional to the value of the current flowing in the primary conductor 110.

Accordingly, the input current measurable range is able to be broadened while reducing the error rate of the output of the current sensor 600. In other words, a current sensor 600 having a broad measurement range while maintaining good sensitivity is able to be achieved.

Note that the position of the gaps 173 in the first magnetic body 170 are not limited to the positions of the opposing corners of the rectangular or the substantially rectangular shape defined by the first magnetic body members 171 and 172, as illustrated in FIG. 27. A first variation on the current sensor 600 according to the present preferred embodiment will be described next.

Figure 28:
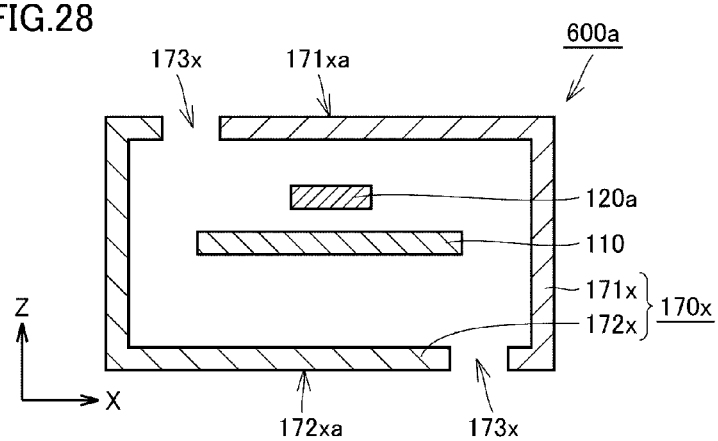
FIG. 28 is a cross-sectional view illustrating the configuration of a current sensor according to a first variation on the sixth preferred embodiment of the present invention.

FIG. 28 is a cross-sectional view illustrating the configuration of the current sensor according to the first variation on the sixth preferred embodiment of the present invention. FIG. 28 illustrates the cross-section of the current sensor from the same direction as that used in FIG. 3.

As illustrated in FIG. 28, a current sensor 600a according to the first variation on the sixth preferred embodiment of the present invention includes a first magnetic body 170x that surrounds the periphery of the primary conductor 110 and one magnetic sensor. The first magnetic body 170x includes two first magnetic body members 171x and 172x. Viewed from the direction in which current flows in the primary conductor 110 (the Y-axis direction), the two first magnetic body members 171x and 172x preferably are rectangular or substantially rectangular, with gaps 173x provided between end portions of the members, and surround the periphery of the primary conductor 110 and the magnetic sensor.

As illustrated in FIG. 28, viewed from the direction in which current flows in the primary conductor 110 (the Y-axis direction), the two first magnetic body members 171x and 172x have J shapes. The two first magnetic body members 171x and 172x have first plates 171xa and 172xa, second plates perpendicular or substantially perpendicular to the first plates 171xa and 172xa, and fifth plates perpendicular or substantially perpendicular to the second plate and opposing the first plates 171xa and 172xa, respectively. The first plates 171xa and 172xa of the two first magnetic body members 171x and 172x, respectively, are parallel or substantially parallel to the primary conductor 110.

Each of the two gaps 173x extends from one end portion to another end portion of the first magnetic body 170x in the direction in which current flows in the primary conductor 110 (the Y-axis direction). Viewed from the direction in which current flows in the primary conductor 110 (the Y-axis direction), the two gaps 173x are located near opposite corners of the rectangle defined by the first magnetic body members 171x and 172x, and between the first plates 171xa and 172xa, respectively, and the fifth plate.

In the current sensor 600a according to the present variation too, a magnetic field leaking from the first magnetic body 170x that is within the magnetic saturation region $T_2$ acts on the first magnetic sensor 120a that is in the low-output region $T_1$. This makes it possible to correct the output of the first magnetic sensor 120a such that the measured voltage value increases.

Specifically, a magnetic field leaking from the first plate 171xa of the first magnetic body member 171x that is magnetically saturated by a magnetic field produced by current flowing in the primary conductor 110 acts on the first magnetic sensor 120a. This corrects the output voltage of the first magnetic sensor 120a so as to approach a virtual output voltage proportional to the value of the current flowing in the primary conductor 110.

Furthermore, the number of gaps provided in the first magnetic body is not limited to two. A second variation on the current sensor 600 according to the present preferred embodiment will be described next.

Figure 29:
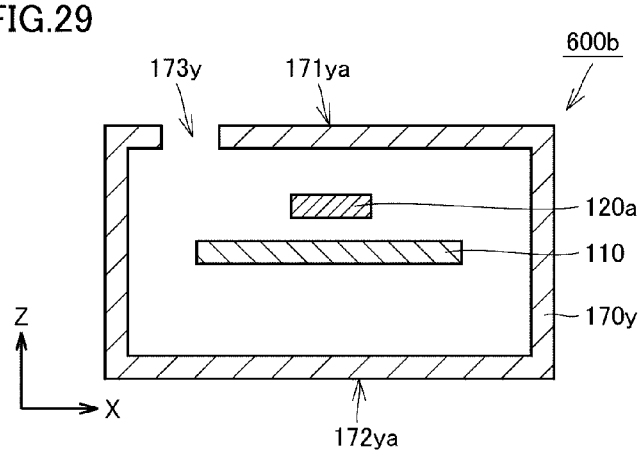
FIG. 29 is a cross-sectional view illustrating the configuration of a current sensor according to a second variation on the sixth preferred embodiment of the present invention.

FIG. 29 is a cross-sectional view illustrating the configuration of a current sensor according to the second variation on the sixth preferred embodiment of the present invention. FIG. 29 illustrates the cross-section of the current sensor from the same direction as that used in FIG. 3.

As illustrated in FIG. 29, a current sensor 600b according to the second variation on the sixth preferred embodiment of the present invention includes a first magnetic body 170y that surrounds the periphery of the primary conductor 110 and one magnetic sensor. The first magnetic body 170y includes a single first magnetic body member. Viewed from the direction in which current flows in the primary conductor 110 (the Y-axis direction), the first magnetic body member is rectangular or substantially rectangular with a single gap 173y provided between end portions of the member, and surrounds the periphery of the primary conductor 110 and the magnetic sensor.

As illustrated in FIG. 29, viewed from the direction in which current flows in the primary conductor 110 (the Y-axis direction), the first magnetic body member has a C shape. The first magnetic body member includes a first plate 171ya, a second plate perpendicular or substantially perpendicular to the first plate 171ya, a fifth plate perpendicular or substantially perpendicular to the second plate and opposing the first plate 171ya, a sixth plate perpendicular or substantially perpendicular to the fifth plate and opposing the second plate, and a seventh plate perpendicular or substantially perpendicular to the sixth plate and opposing the fifth plate. The first plate 171ya of the first magnetic body member is parallel or substantially parallel to the primary conductor 110.

The gap 173y extends from one end portion to another end portion of the first magnetic body 170y in the direction in which current flows in the primary conductor 110 (the Y-axis direction). Viewed from the direction in which current flows in the primary conductor 110 (the Y-axis direction), the gap 173y is located near an opposite corner of the rectangle defined by the first magnetic body member, and between the first plate 171ya and the seventh plate.

In the current sensor 600b according to the present variation too, a magnetic field leaking from the first magnetic body 170y that is within the magnetic saturation region $T_2$ acts on the first magnetic sensor 120a that is in the low-output region $T_1$. This makes it possible to correct the output of the first magnetic sensor 120a such that the measured voltage value increases.

Specifically, a magnetic field leaking from the first plate 171*ya* of the first magnetic body member that is magnetically saturated by a magnetic field produced by current flowing in the primary conductor 110 acts on the first magnetic sensor 120*a*. This corrects the output voltage of the first magnetic sensor 120*a* so as to approach a virtual output voltage proportional to the value of the current flowing in the primary conductor 110.

Hereinafter, a current sensor according to a seventh preferred embodiment of the present invention will be described. Note that a current sensor 700 according to the seventh preferred embodiment differs from the current sensor according to the first preferred embodiment mainly in terms of the configuration of the first magnetic body, the configuration of the second magnetic body, and that only a single magnetic sensor is provided, and thus descriptions of other elements and features of the configuration will not be repeated.

Seventh Preferred Embodiment

Figure 30:
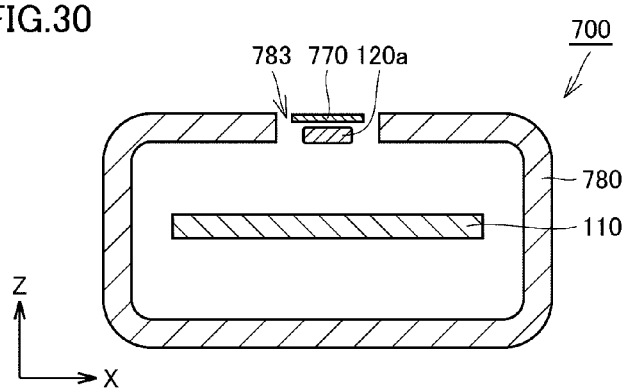
FIG. 30 is a cross-sectional view illustrating the configuration of a current sensor according to a seventh preferred embodiment of the present invention.

FIG. 30 is a cross-sectional view illustrating the configuration of the current sensor according to the seventh preferred embodiment of the present invention. FIG. 30 illustrates the cross-section of the current sensor from the same direction as that used in FIG. 3. Additionally, FIG. 30 only illustrates the first magnetic sensor 120*a* of the circuit board.

As illustrated in FIG. 30, the current sensor 700 according to the seventh preferred embodiment of the present invention includes only a single first magnetic sensor 120*a* as a magnetic sensor. The first magnetic sensor 120*a* is positioned above the primary conductor 110. Note that a penetrating portion is not provided in the primary conductor 110 in the present preferred embodiment.

Additionally, the current sensor 700 includes a magnetic body that surrounds the periphery of the primary conductor 110 and the first magnetic sensor 120*a*. The magnetic body includes a first magnetic body 770 including a plate, and a second magnetic body 780 positioned at a distance from the first magnetic body 770. The first magnetic body 770 is magnetically saturated by a magnetic field produced by current flowing in the primary conductor 110 before the second magnetic body 780.

Viewed from the direction in which current flows in the primary conductor 110 (the Y-axis direction), the second magnetic body 780 includes a single C-shaped second magnetic body member. Viewed from the direction in which current flows in the primary conductor 110 (the Y-axis direction), the second magnetic body member is rectangular or substantially rectangular with a single gap 783 provided between end portions of the member, and surrounds the periphery of the primary conductor 110.

The first magnetic body 770 includes a single plate-shaped first magnetic body member. The first magnetic body 770 is parallel or substantially parallel to the primary conductor 110.

The first magnetic sensor 120*a* and the first magnetic body 770 are each located at the gap 783 in the second magnetic body 780, at a distance from the second magnetic body 780. The first magnetic body 770 extends along the direction of the detection axis of the first magnetic sensor 120*a* (that is, along the magnetism sensing direction), and opposes the first magnetic sensor 120*a* at a distance from the first magnetic sensor 120*a*. Viewed from the first magnetic sensor 120*a*, the first magnetic body 770 is positioned on the opposite side from the primary conductor 110.

In the current sensor 700 according to the present preferred embodiment too, a magnetic field leaking from the first magnetic body 770 that is within the magnetic saturation region $T_2$ acts on the first magnetic sensor 120*a* that is in the low-output region $T_1$. This makes it possible to correct the output of the first magnetic sensor 120*a* such that the measured voltage value increases.

Additionally, the first magnetic body 770 and the second magnetic body 780 surround the periphery of the first magnetic sensor 120*a*, which makes it possible to prevent a situation in which an external magnetic field, which is a cause of error, reaches the first magnetic sensor 120*a*.

Accordingly, the input current measurable range is able to be broadened while reducing the error rate of the output of the current sensor 700. In other words, a current sensor 700 having a broad measurement range while maintaining good sensitivity is able to be achieved.

Hereinafter, a current sensor according to an eighth preferred embodiment of the present invention will be described. Note that a current sensor 800 according to the eighth preferred embodiment differs from the current sensor according to the seventh preferred embodiment mainly in terms of the configuration of the first magnetic body, and thus descriptions of other elements or features of the configuration will not be repeated.

Eighth Preferred Embodiment

Figure 31:
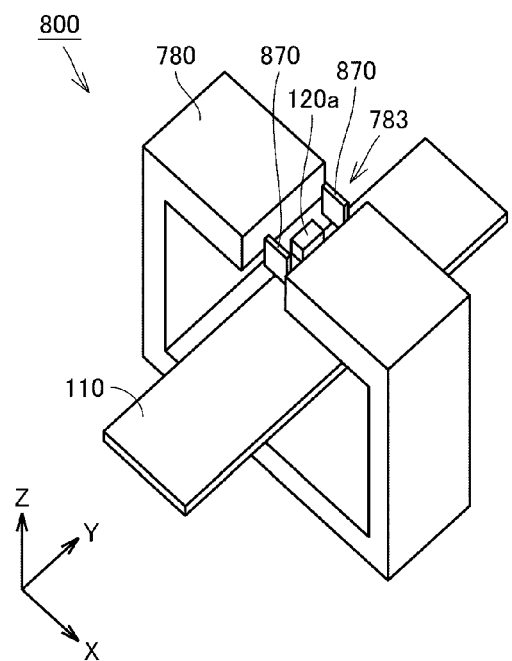
FIG. 31 is a perspective view illustrating the configuration of a current sensor according to an eighth preferred embodiment of the present invention.
Figure 32:
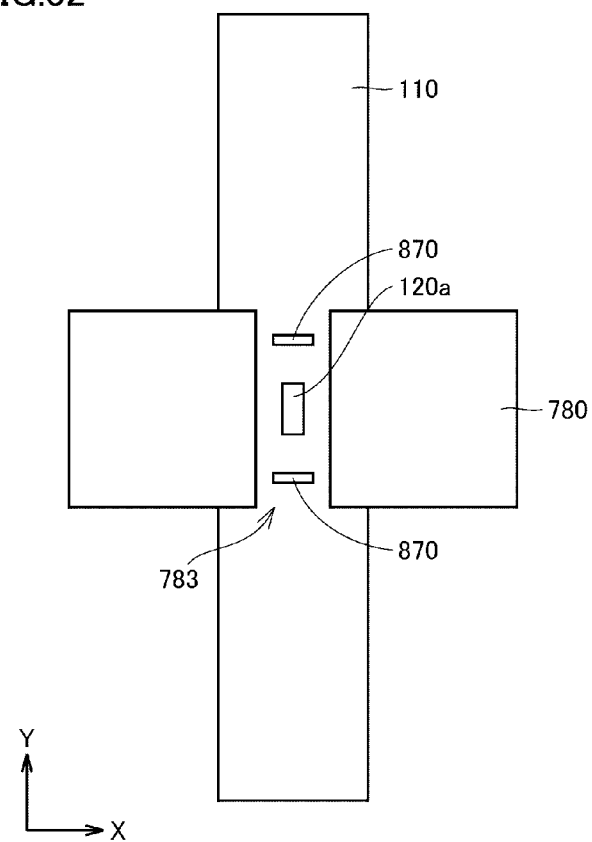
FIG. 32 is a plan view illustrating the configuration of the current sensor according to the eighth preferred embodiment of the present invention.

FIG. 31 is a perspective view illustrating the configuration of the current sensor according to the eighth preferred embodiment of the present invention. FIG. 32 is a plan view illustrating the configuration of the current sensor according to the eighth preferred embodiment of the present invention. FIGS. 31 and 32 only illustrate the first magnetic sensor 120*a* of the circuit board.

As illustrated in FIGS. 31 and 32, in the current sensor 800 according to the eighth preferred embodiment of the present invention, the magnetic body includes a first magnetic body 870 including a plate, and the second magnetic body 780 positioned at a distance from the first magnetic body 870. The first magnetic body 870 is magnetically saturated by a magnetic field produced by current flowing in the primary conductor 110 before the second magnetic body 780.

The first magnetic sensor 120*a* and the first magnetic body 870 are each located at the gap 783 in the second magnetic body 780, at a distance from the second magnetic body 780. The first magnetic body 870 includes two plate-shaped first magnetic body members that oppose each other.

The first magnetic sensor 120*a* is positioned between the two first magnetic body members. The two first magnetic body members extend along the direction of the detection axis of the first magnetic sensor 120*a* (that is, along the magnetism sensing direction), and oppose the first magnetic sensor 120*a* at a distance from the first magnetic sensor 120*a*. The two first magnetic body members are each perpendicular or substantially perpendicular to the primary conductor 110.

In the current sensor 800 according to the present preferred embodiment too, a magnetic field leaking from the first magnetic body 870 that is within the magnetic saturation region $T_2$ acts on the first magnetic sensor 120*a* that is in the low-output region $T_1$. This makes it possible to correct the output of the first magnetic sensor 120*a* such that the measured voltage value increases.

Additionally, the first magnetic body 870 and the second magnetic body 780 surround the periphery of the first magnetic sensor 120*a*, which makes it possible to prevent a situation in which an external magnetic field, which is a cause of error, reaches the first magnetic sensor 120*a*.

Accordingly, the input current measurable range is able to be broadened while reducing the error rate of the output of the current sensor 800. In other words, a current sensor 800 having a broad measurement range while maintaining good sensitivity is able to be achieved.

In the configurations of the current sensors according to the foregoing preferred embodiments, variations obtained by suitably combining configurations that can be combined with each other are of course included in preferred embodiments of the present invention.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A current sensor comprising:
   a primary conductor in which a current to be measured flows;
   at least one magnetic sensor that detects a strength of a magnetic field produced by the current flowing in the primary conductor; and
   a magnetic body that surrounds peripheries of the primary conductor and the magnetic sensor; wherein
   output characteristics of the magnetic sensor include a low-output region in which a measured voltage value lower than a virtual output voltage proportional to a value of the current is outputted;
   magnetization characteristics of the magnetic body include a magnetic saturation region in which permeability decreases in ranges where an absolute value of the current is no less than a threshold; and
   an output of the magnetic sensor is corrected such that the measured voltage value increases as a result of a magnetic field leaking from the magnetic body that is within the magnetic saturation region acting on the magnetic sensor that is in the low-output region.

2. The current sensor according to claim 1, wherein
   the primary conductor has a plate shape; and
   the magnetic sensor is capable of detecting a magnetic field in a direction perpendicular or substantially perpendicular to both a thickness direction of the primary conductor and a direction in which the current flows.

3. The current sensor according to claim 1, wherein the magnetic sensor is disposed on at least one of one side and another side of the primary conductor in the thickness direction of the primary conductor, in a central area of the primary conductor in the width direction of the primary conductor.

4. The current sensor according to claim 1, wherein
   a first magnetic sensor and a second magnetic sensor are included in the magnetic sensor; and
   the first magnetic sensor and the second magnetic sensor are positioned opposite to each other with the primary conductor interposed therebetween.

5. The current sensor according to claim 4, further comprising:
   a calculator that calculates the value of the current by processing a detection value of the first magnetic sensor and a detection value of the second magnetic sensor; wherein
   the detection value of the first magnetic sensor and the detection value of the second magnetic sensor have opposite phases with respect to the strength of the magnetic field produced by the current flowing in the primary conductor; and
   the calculator is a subtractor or a differential amplifier.

6. The current sensor according to claim 4, further comprising:
   a calculator that calculates the value of the current by processing a detection value of the first magnetic sensor and a detection value of the second magnetic sensor; wherein
   the detection value of the first magnetic sensor and the detection value of the second magnetic sensor have the same phase with respect to the strength of the magnetic field produced by the current flowing in the primary conductor; and
   the calculator is an adder or a summing amplifier.

7. A current sensor comprising:
   a primary conductor in which a current to be measured flows;
   at least one magnetic sensor that detects a strength of a magnetic field produced by the current flowing in the primary conductor; and
   a magnetic body that surrounds peripheries of the primary conductor and the magnetic sensor; wherein
   the magnetic body includes a plate that extends along a direction of a detection axis of the magnetic sensor, and opposes the magnetic sensor at a distance from the magnetic sensor; and
   an output voltage of the magnetic sensor is corrected to approach a virtual output voltage proportional to a value of the current as a result of a magnetic field leaking from the plate magnetically saturated by a magnetic field produced by the current acting on the magnetic sensor.

8. The current sensor according to claim 7, wherein
   the magnetic body includes a first magnetic body including the plate and a second magnetic body positioned at a distance from the first magnetic body; and
   the first magnetic body is magnetically saturated by the magnetic field produced by the current before the second magnetic body.

9. The current sensor according to claim 8, wherein
   a gap is provided in the second magnetic body and causes the second magnetic body to be shaped as a tube that is non-continuous in a circumferential direction.

10. The current sensor according to claim 9, wherein the second magnetic body surrounds a periphery of the first magnetic body.

11. The current sensor according to claim 9, wherein the first magnetic body is positioned at the gap of the second magnetic body.

12. The current sensor according to claim 8, wherein the second magnetic body is shaped as a tube that is continuous throughout the entire circumference.

13. The current sensor according to claim 8, wherein
    the first magnetic body includes at least one first magnetic body member; and
    the second magnetic body includes at least one second magnetic body member.

14. The current sensor according to claim 13, wherein the first magnetic body member has a plate shape.

15. The current sensor according to claim 13, wherein
    the first magnetic body includes the two first magnetic body members; and
    the magnetic sensor is positioned between the two first magnetic body members.

16. The current sensor according to claim 7, wherein
    the primary conductor has a plate shape; and
    the magnetic sensor is capable of detecting a magnetic field in a direction perpendicular or substantially perpendicular to both a thickness direction of the primary conductor and a direction in which the current flows.

17. The current sensor according to claim 7, wherein the magnetic sensor is disposed on at least one of one side and another side of the primary conductor in the thickness direction of the primary conductor, in a central area of the primary conductor in the width direction of the primary conductor.

18. The current sensor according to claim 7, wherein
a first magnetic sensor and a second magnetic sensor are included in the magnetic sensor; and
the first magnetic sensor and the second magnetic sensor are positioned opposite to each other with the primary conductor interposed therebetween.

19. The current sensor according to claim 18, further comprising:
a calculator that calculates the value of the current by processing a detection value of the first magnetic sensor and a detection value of the second magnetic sensor; wherein
the detection value of the first magnetic sensor and the detection value of the second magnetic sensor have opposite phases with respect to the strength of the magnetic field produced by the current flowing in the primary conductor; and
the calculator is a subtractor or a differential amplifier.

20. The current sensor according to claim 18, further comprising:
a calculator that calculates the value of the current by processing a detection value of the first magnetic sensor and a detection value of the second magnetic sensor; wherein
the detection value of the first magnetic sensor and the detection value of the second magnetic sensor have the same phase with respect to the strength of the magnetic field produced by the current flowing in the primary conductor; and
the calculator is an adder or a summing amplifier.

* * * * *